(12) United States Patent
Kurokawa et al.

(10) Patent No.: US 12,333,070 B2
(45) Date of Patent: Jun. 17, 2025

(54) ELECTRONIC DEVICE

(71) Applicant: SEMICONDUCTOR ENERGY LABORATORY CO., LTD., Atsugi (JP)

(72) Inventors: Yoshiyuki Kurokawa, Kanagawa (JP); Hiromichi Godo, Kanagawa (JP); Kouhei Toyotaka, Kanagawa (JP); Kazuki Tsuda, Kanagawa (JP); Satoru Ohshita, Kanagawa (JP); Hidefumi Rikimaru, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/594,319

(22) Filed: Mar. 4, 2024

(65) Prior Publication Data
US 2024/0256037 A1    Aug. 1, 2024

Related U.S. Application Data

(63) Continuation of application No. 17/671,905, filed on Feb. 15, 2022, now Pat. No. 11,921,919.

(30) Foreign Application Priority Data

Feb. 19, 2021   (JP) .................................. 2021-024762

(51) Int. Cl.
*G06F 3/01* (2006.01)
*G02B 27/01* (2006.01)
(Continued)

(52) U.S. Cl.
CPC ......... *G06F 3/013* (2013.01); *G02B 27/0172* (2013.01); *G06F 3/012* (2013.01);
(Continued)

(58) Field of Classification Search
None
See application file for complete search history.

(56) References Cited

U.S. PATENT DOCUMENTS 8,605,010 B2    12/2013  Yamazaki et al.
9,716,852 B2     7/2017  Kurokawa
(Continued)

FOREIGN PATENT DOCUMENTS

JP      10-078406 A      3/1998
JP    2000-002856 A      1/2000
(Continued)

OTHER PUBLICATIONS

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

*Primary Examiner* — Jwalant Amin
(74) *Attorney, Agent, or Firm* — NIXON PEABODY LLP; Jeffrey L. Costellia

(57) ABSTRACT

To provide a novel electronic device. The electronic device includes a housing and a display device. The display device includes a first layer, a second layer, and a third layer. The first layer, the second layer, and the third layer are provided in different layers. The first layer includes a driver circuit and an arithmetic circuit. The second layer includes pixel circuits and a cell array. The third layer includes light-receiving devices and light-emitting devices. The pixel circuits each have a function of controlling light emission of the light-emitting device. The driver circuit has a function of controlling the pixel circuits. The arithmetic circuit has a function of performing arithmetic processing on the basis of first data corresponding to currents output from the light-receiving devices and second data corresponding to a potential held in the cell array.

7 Claims, 21 Drawing Sheets

(51) Int. Cl.
- G09G 3/00 (2006.01)
- G09G 3/3225 (2016.01)
- H10K 59/121 (2023.01)
- H10K 65/00 (2023.01)
- G06F 3/147 (2006.01)
- H10D 30/67 (2025.01)
- H10D 86/40 (2025.01)
- H10D 86/60 (2025.01)
- H10K 59/65 (2023.01)

(52) U.S. Cl.
CPC ........... G09G 3/002 (2013.01); G09G 3/3225 (2013.01); H10K 59/1213 (2023.02); H10K 65/00 (2023.02); G02B 2027/0178 (2013.01); G06F 3/147 (2013.01); G09G 2354/00 (2013.01); G09G 2360/14 (2013.01); H10D 30/6734 (2025.01); H10D 30/6743 (2025.01); H10D 30/6755 (2025.01); H10D 86/423 (2025.01); H10D 86/471 (2025.01); H10D 86/481 (2025.01); H10D 86/60 (2025.01); H10K 59/65 (2023.02)

(56) References Cited

U.S. PATENT DOCUMENTS

| | | |
|---|---|---|
| 9,773,832 B2 | 9/2017 | Kurokawa |
| 9,851,942 B2 | 12/2017 | Kurokawa |
| 10,141,069 B2 | 11/2018 | Ikeda et al. |
| 10,319,743 B2 | 6/2019 | Kurokawa |
| 10,699,794 B2 | 6/2020 | Ikeda et al. |
| 11,004,528 B2 | 5/2021 | Ikeda et al. |
| 11,037,525 B2 | 6/2021 | Shiokawa et al. |
| 2003/0057423 A1 | 3/2003 | Shimoda et al. |
| 2007/0097021 A1 | 5/2007 | Yamazaki et al. |
| 2011/0096185 A1 | 4/2011 | Aoki et al. |
| 2016/0293643 A1 | 10/2016 | Kim et al. |
| 2016/0343452 A1 | 11/2016 | Ikeda et al. |
| 2017/0317085 A1 | 11/2017 | Kurokawa |
| 2018/0004881 A1 | 1/2018 | Li et al. |
| 2018/0005588 A1 | 1/2018 | Kurokawa |
| 2019/0164620 A1 | 5/2019 | Ikeda et al. |
| 2019/0274537 A1* | 9/2019 | Brown, Jr. ........... A61B 3/0025 |
| 2021/0264998 A1 | 8/2021 | Ikeda et al. |
| 2021/0353219 A1 | 11/2021 | Narayanan et al. |

FOREIGN PATENT DOCUMENTS

| | | |
|---|---|---|
| JP | 2010-146386 A | 7/2010 |
| JP | 2016-219011 A | 12/2016 |
| JP | 2017-130195 A | 7/2017 |
| JP | 2019-046374 A | 3/2019 |
| JP | 2019-047006 A | 3/2019 |
| WO | WO-2019/215538 | 11/2019 |

* cited by examiner

ANN

380A

380B

FIG. 20A  FIG. 20B
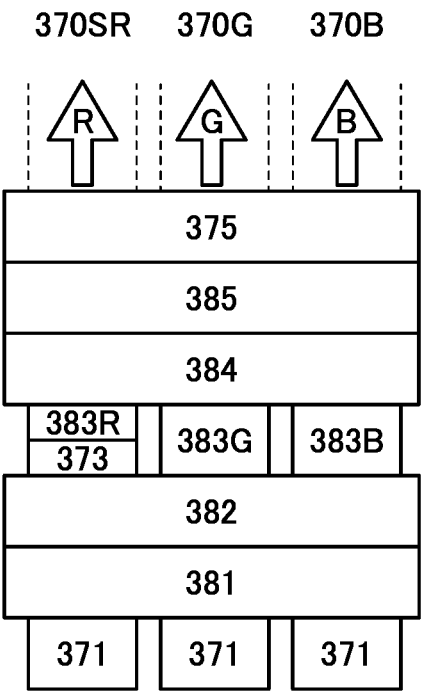
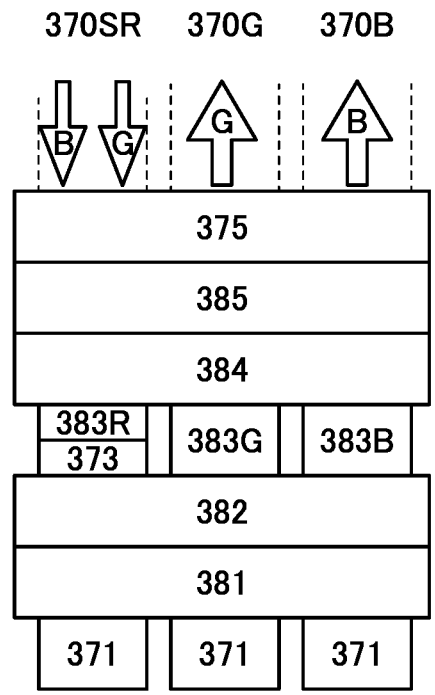
FIG. 20C  FIG. 20D  FIG. 20E  FIG. 20F  FIG. 20G
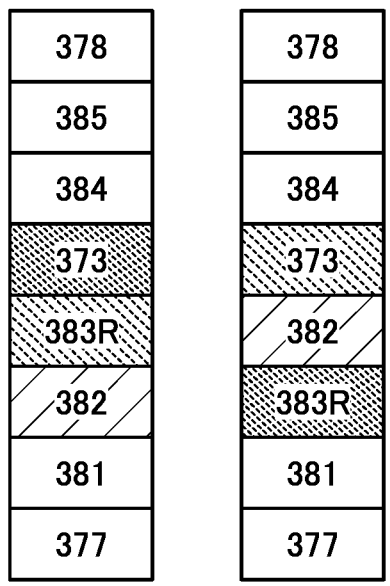
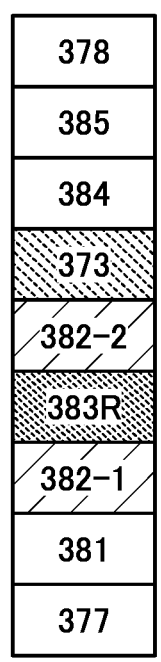
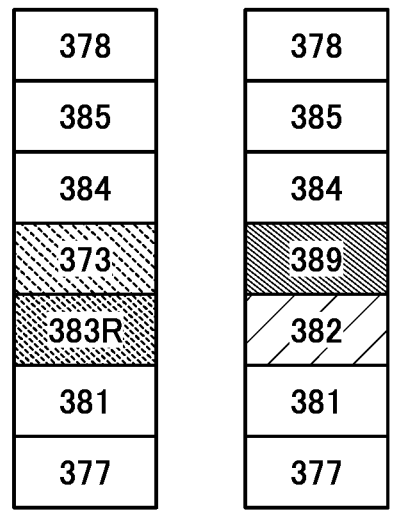

ELECTRONIC DEVICE

BACKGROUND OF THE INVENTION

1. Field of the Invention

One embodiment of the present invention relates to an electronic device. One embodiment of the present invention relates to a wearable electronic device including a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof.

2. Description of the Related Art

In recent years, head mounted display (HMD)-type electronic devices suitable for applications such as virtual reality (VR) and augmented reality (AR) have been widely used. HMDs are capable of displaying a video showing 360-degree view of the user's surroundings according to the movement of the user's head or the user's eyes or operation; thus, the user can have a high sense of immersion and a high realistic sensation.

A display device included in an HMD enlarges an image through an optical component or the like so that the image can be viewed. In this case, the size of a housing might increase because of providing the optical component in the display device or the user might easily recognize pixels and strongly sense graininess; hence, the display device is required to have a high resolution and/or a smaller size. For example, Patent Document 1 discloses an HMD including minute pixels provided with transistors capable of high-speed operation.

REFERENCE

[Patent Document 1] Japanese Published Patent Application No. 2000-002856

SUMMARY OF THE INVENTION

To provide a higher-level user experience, HMD-type electronic devices preferably have not only a display function but also a sensing function. However, in the case where various kinds of sensors such as an image sensor and a temperature sensor are installed in a housing, an increase in the number of components might increase the size of an HAMID-type electronic device, resulting in significantly impaired wearability or the like of the UN/ID-type electronic device.

An object of one embodiment of the present invention is to provide an electronic device reduced in size and weight. Another object of one embodiment of the present invention is to provide an electronic device that is easy to wear. Another object of one embodiment of the present invention is to provide a novel electronic device.

Note that the description of these objects does not preclude the existence of other objects. One embodiment of the present invention does not need to achieve all these objects. Objects other than these can be derived from the description of the specification, the drawings, the claims, and the like.

One embodiment of the present invention is an electronic device including a housing and a display device, in which the display device includes a first layer, a second layer, and a third layer, the first layer, the second layer, and the third layer are provided in different layers, the first layer includes a driver circuit and an arithmetic circuit, the second layer includes pixel circuits and a cell array, the third layer includes light-receiving devices and light-emitting devices, the pixel circuits are each configured to control light emission of the light-emitting device, the driver circuit is configured to control the pixel circuits, and the arithmetic circuit is configured to perform arithmetic processing on the basis of first data corresponding to currents output from the light-receiving devices and second data corresponding to a potential held in the cell array.

In the electronic device of one embodiment of the present invention, the first layer preferably includes a first transistor including a semiconductor layer containing silicon in a channel formation region, and the second layer preferably includes a second transistor including a semiconductor layer containing a metal oxide in a channel formation region.

In the electronic device of one embodiment of the present invention, the metal oxide preferably contains In, Zn, and an element M (M is Al, Ga, Y, or Sn).

In the electronic device of one embodiment of the present invention, the light-receiving devices each preferably include an organic light-emitting diode, and the light-emitting devices are preferably organic EL devices.

In the electronic device of one embodiment of the present invention, the light-emitting devices and the light-receiving devices are preferably separated from each other by a photolithography method.

In the electronic device of one embodiment of the present invention, the housing is preferably configured to place the display device at a position where an image of user's eyes can be captured, and the light-receiving devices are each preferably configured to capture an image of the user's eyes and/or the surroundings of the eyes.

In the electronic device of one embodiment of the present invention, the light-emitting devices are preferably provided in a display portion of the display device, and the light-receiving devices are preferably located at both ends of the display portion.

In the electronic device of one embodiment of the present invention, the housing preferably includes a mounting portion and a pair of lenses.

Note that other embodiments of the present invention will be described in the following embodiments with reference to the drawings.

One embodiment of the present invention can provide an electronic device reduced in size and weight. Another embodiment of the present invention can provide an electronic device that is easy to wear. Another embodiment of the present invention can provide a novel electronic device.

Note that the description of these effects does not preclude the existence of other effects. One embodiment of the present invention does not need to have all these effects. Effects other than these can be derived from the description of the specification, the drawings, the claims, and the like.

BRIEF DESCRIPTION OF THE DRAWINGS

FIGS. 20A to 20G each illustrate a structure example of a display device.

DETAILED DESCRIPTION OF THE INVENTION

Figure 1A:
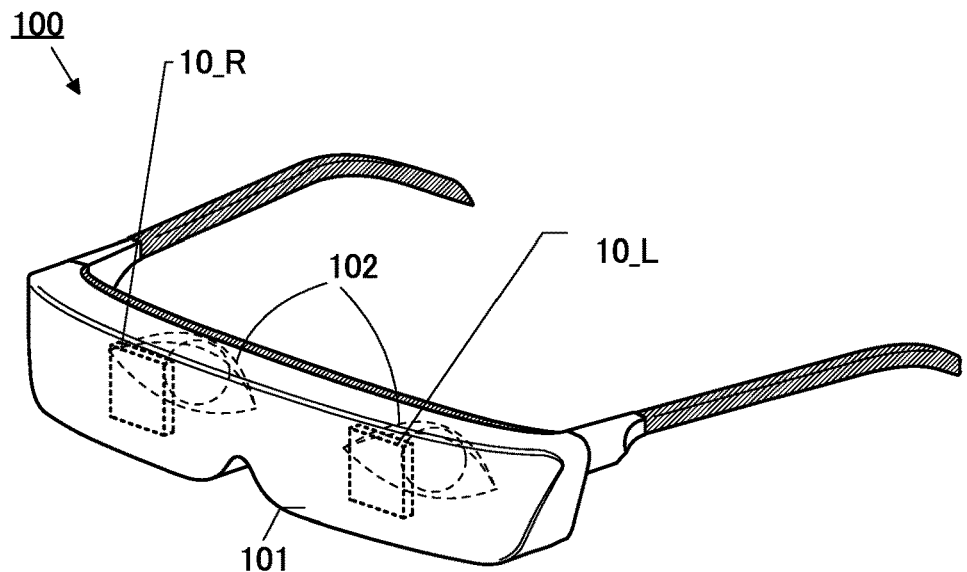
FIGS. 1A to 1C illustrate a structure example of a display device and a structure example of an electronic device.

Embodiments will be described below with reference to the drawings. The embodiments can be implemented with various modes. It will be readily appreciated by those skilled in the art that modes and details can be changed in various ways without departing from the spirit and scope of the present invention. Therefore, the present invention should not be construed as being limited to the description of embodiments below.

In the drawings, sizes, layer thicknesses, or regions are sometimes exaggerated for clarity. Therefore, the scale is not limited to those illustrated in the drawings. Note that the drawings schematically show ideal examples, and embodiments of the present invention are not limited to shapes or values shown in the drawings.

Unless otherwise specified, an off-state current in this specification and the like refers to a drain current of a transistor in an off state (also referred to as a non-conducting state or a cutoff state). Unless otherwise specified, the off state of an n-channel transistor means that the voltage between a gate and a source ($V_{gs}$) is lower than the threshold voltage ($V_{th}$), and the off state of a p-channel transistor means that $V_{gs}$ is higher than $V_{th}$.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is referred to as an oxide semiconductor in some cases. That is, an OS transistor can also be referred to as a transistor including a metal oxide or an oxide semiconductor.

Embodiment 1

In one embodiment of the present invention, an electronic device of one embodiment of the present invention will be described. The electronic device of one embodiment of the present invention can be suitably used also as a wearable electronic device for VR and/or AR application(s).

Structure Example of Electronic Device

FIG. 1A is a perspective view of a goggle-type electronic device 100 as an example of a wearable electronic device. The electronic device 100 illustrated in FIG. 1A includes a pair of display devices 10_L and 10_R in a housing 101. In addition, eyes (eyeballs) 102 of a user wearing the electronic device 100 are illustrated in FIG. 1A. As illustrated in FIG. 1A, the pair of display devices 10_L and 10_R is positioned so as to overlap with the eyes 102, for example. In the case where the housing 101 is provided with an acceleration sensor such as a gyroscope sensor, the orientation of the user's head can be determined and an image according to the orientation can be displayed.

In this specification and the like, in the cases where matters that apply to both the display devices 10_L and 10_R are described and they do not need to be differentiated from each other, for example, the display devices 10_L and 10_R may be simply referred to as the display device 10.

Figure 1B:
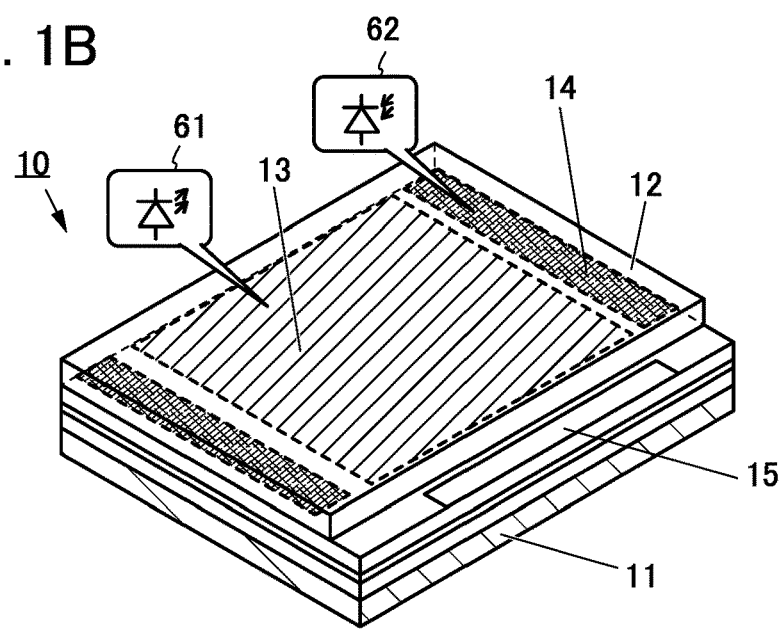

FIG. 1B is a schematic perspective view of the display device 10 that can be used for the display devices 10_L and 10_R illustrated in FIG. 1A.

The display device 10 includes a substrate 11 and a substrate 12. The display device 10 includes a display portion 13 and light-receiving portions 14, which are provided between the substrate 11 and the substrate 12.

The display portion 13 is a region where an image is displayed in the display device 10. The display portion 13 includes pixel circuits and pixels including light-emitting devices connected to the pixel circuits. Light-emitting devices 61 whose light intensity is controlled by the pixel circuits are provided in the display portion 13.

The light-receiving portions 14 are each a region where an image around the display device 10 is captured. Signals generated in the light-receiving portions 14 can be subjected to arithmetic processing in a region where an arithmetic processing unit including an arithmetic circuit and a cell array is provided. The light-receiving portions 14 each include light-receiving devices 62 each of which outputs a current corresponding to light intensity (photocurrent). The light-receiving device 62 is a device that converts light energy into electric energy and may be referred to as a photoelectric conversion device.

In this specification and the like, the term "element" can be replaced with the term "device" in some cases. For example, a display element, a light-emitting element, and a liquid crystal element can be rephrased as a display device, a light-emitting device, and a liquid crystal device, respectively.

Figure 1C:
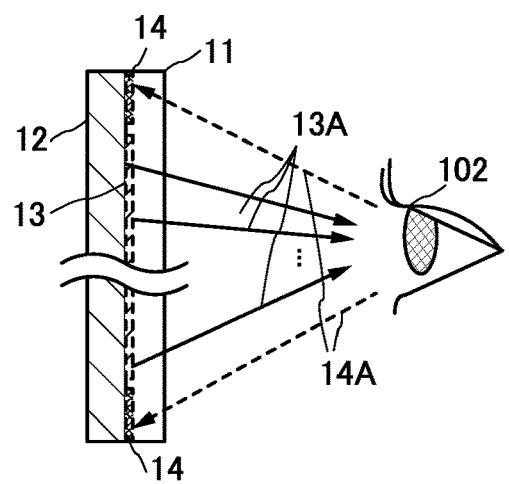

In the display device 10, various kinds of signals and power supply potentials are input from the outside through a terminal portion 15, whereby an image can be displayed on the display portion 13 and an image can be captured in the light-receiving portions 14. A plurality of layers are provided between the substrate 11 and the substrate 12, and each of the layers is provided with transistors for circuit operations, light-receiving devices 62 each of which outputs a signal in accordance with received light, or the light-emitting devices 61 each of which emits light. The layer in which the transistors are provided includes pixel circuits each having a function of controlling light emission of the corresponding light-emitting device 61, a driver circuit having a function of controlling the pixel circuits, an arithmetic circuit having a function of performing arithmetic processing on signals generated in the light-receiving devices 62, a cell array including transistors for performing arithmetic operation in the arithmetic circuit, and the like. FIG. 1C is a schematic view illustrating the case where the display device 10 including the display portion 13 and the light-receiving portions 14 is placed close to the eyes 102 of the user. In FIG. 1C, the display portion 13 is provided between the light-receiving portions 14.

Light 13A emitted from the light-emitting devices 61 in the display portion 13 allows the eyes 102 of the user to see an image. Examples of the light 13A may include infrared light in addition to visible light.

Light 14A reflected by the eyes 102 of the user and/or their surroundings is converted into electric signals by the light-receiving devices 62 in the light-receiving portions 14. Data acquired in the light-receiving portions 14 may be a captured image of eyeballs (or the state of pupils) for eye tracking or a captured image of movement of the surroundings of the eyeballs (e.g., eyelids, glabella, and the inner or outer corners of eyes).

Arrangement Examples of Display Portion and Light-Receiving Portion

FIGS. 2A to 2E are schematic views illustrating arrangement examples of the display portion 13 and the light-receiving portions 14 illustrated in FIGS. 1B and 1C.

Figure 2A:
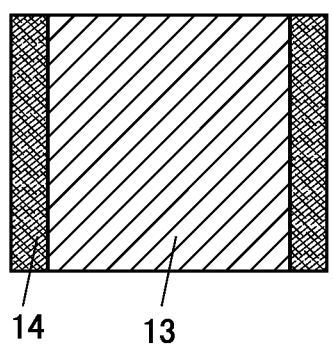
FIGS. 2A to 2E each illustrate a structure example of a display device.
Figure 2B:
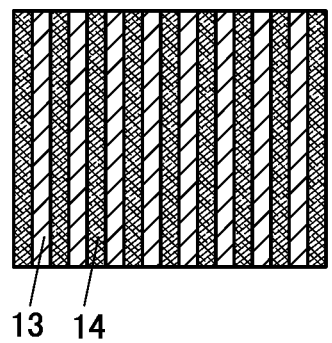

In the example illustrated in FIG. 2A, the display portion 13 and the light-receiving portions 14 are located in different regions. In FIG. 2A, the light-receiving portions 14 are arranged in linear shapes at both ends of the display portion 13. An image of the upward and downward motion of eyelids like blinking can be captured in the light-receiving portions 14, which have linear shapes. When the blinking motion of eyelids is sensed in this manner, inferring operation according to whether the user has blinked can be performed in the arithmetic circuit connected to the light-receiving portions 14. Each of a plurality of light-receiving portions 14 that can be provided in linear shapes may be arranged so as to be sandwiched between the display portions 13, as illustrated in FIG. 2B.

Figure 2C:
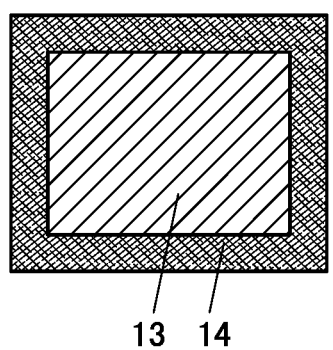
Figure 2D:
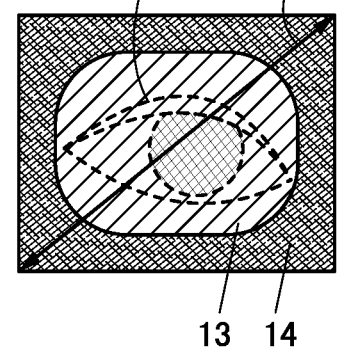

In the example illustrated in FIG. 2C, the light-receiving portion 14 is provided so as to surround the display portion 13. In FIG. 2C, the light-receiving portion 14 is provided to have a ring-like shape. In the case where the light-receiving portion 14 is provided in a ring-like shape, for example, the motion around eyeballs, such as the motion of eyelids, glabella, and the inner or outer corners of eyes, can be sensed, so that inference operation for the direction of eyes can be performed in the arithmetic circuit connected to the light-receiving portion 14, without capturing an image of the eyeball motion. The light-receiving portion 14 that can have a ring-like shape is preferably provided around the display portion 13 larger than the eye 102, as illustrated in FIG. 2D.

In that case, the display device 10 that has a diagonal panel size $L_D$ of greater than or equal to 0.1 inches and less than or equal to 5 inches, preferably 0.5 inches and less than or equal to 3 inches, further preferably greater than or equal to 1 inches and less than or equal to 2 inches, still further preferably greater than or equal to 1.3 inches and less than or equal to 1.7 inches, yet still further preferably greater than or equal to 1.5 inches and less than or equal to 1.6 inches can be provided with the display portion 13 according to the size of the eye 102 and the light-receiving portion 14 according to the size of the eye 102. With this structure, when the display device 10 is brought closer to the eyes 102 of the user, data on the eyes 102 of the user and their surroundings can be acquired in the light-receiving portion 14 and a wide field of view of an image displayed on the display portion 13 can be achieved.

In FIGS. 2A to 2D, the display portion(s) 13 and the light-receiving portion(s) 14 are located in different regions. That is, the light-emitting devices 61 are placed separately from the light-receiving devices 62. With this structure, the layout density of the light-emitting devices 61 can be different from that of the light-receiving devices 62.

Figure 2E:
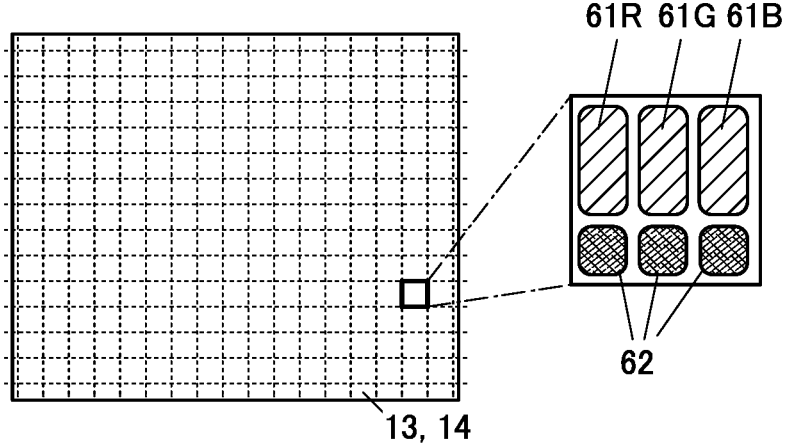

The light-emitting devices 61 in the display portion 13 may be provided so as to correspond to the light-receiving devices 62 in the light-receiving portion 14. For example, as illustrated in FIG. 2E, the display portion 13 and the light-receiving portion 14 may be located in the same region. In the case of FIG. 2E, each pixel can be provided with light-emitting devices 61R, 61G, and 61B for respective colors of R, G, and B and the light-receiving devices 62, for example. Such a structure allows an increase in the area of the display portion 13 and the area of the light-receiving portion 14. The density of the light-emitting devices 61 and the density of the light-receiving devices 62 can be uniform.

Structure Examples of Display Device

Structures of the display device 10 that can be used for the display devices 10_L and 10_R illustrated in FIGS. 1A and 1B will be described with reference to FIG. 3A to FIG. 5B.

Figure 3A:
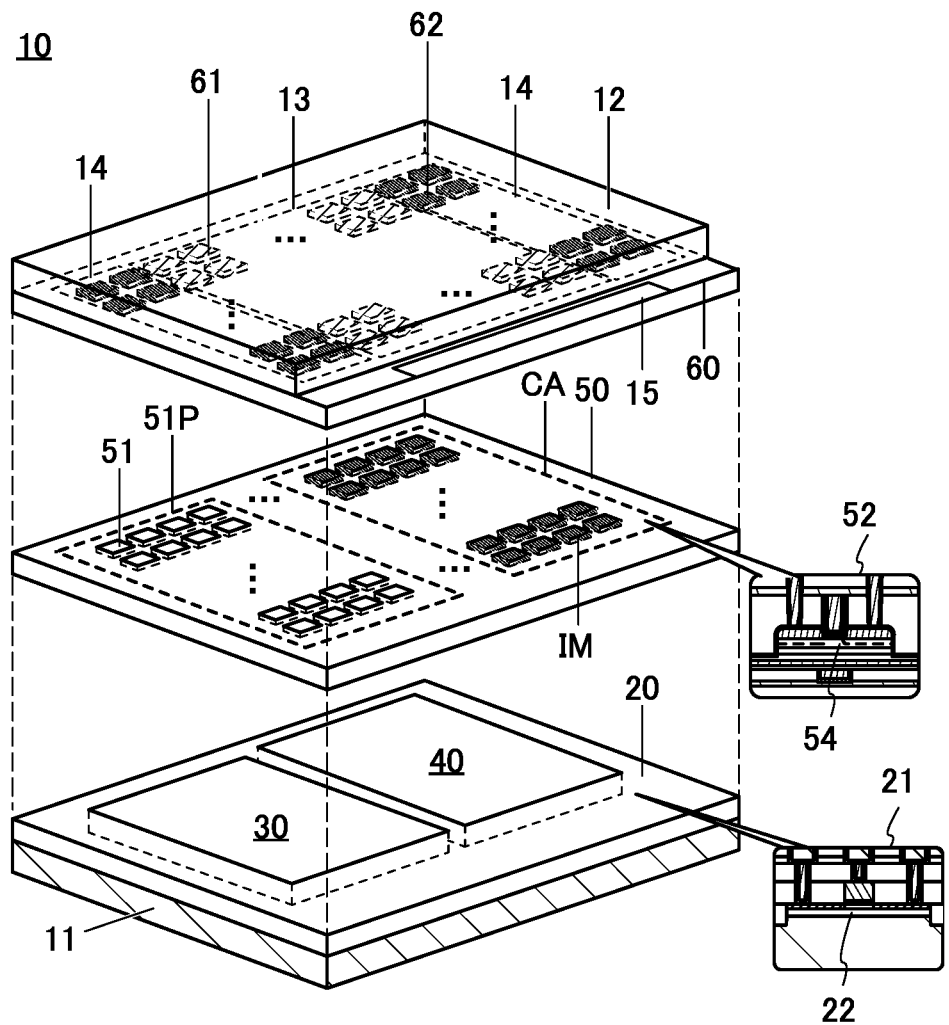
FIGS. 3A and 3B illustrate a structure example of a display device.

FIG. 3A is a perspective view schematically illustrating structures of layers provided between the substrate 11 and the substrate 12 in the display device 10 illustrated in FIG. 1B.

A layer 20 is provided over the substrate 11. In the layer 20, a driver circuit 30 and an arithmetic circuit 40 are provided, for example. The layer 20 includes transistors 21 each including silicon in a channel formation region 22 (the transistors are also referred to as Si transistors). The substrate 11 is, for example, a silicon substrate. A silicon substrate is preferably used because of having higher thermal conductivity than a glass substrate.

The transistor 21 can be a transistor including single crystal silicon in its channel formation region, for example. In particular, a transistor in which a channel formation region includes single crystal silicon is preferably used as a transistor provided in the layer 20, in which case the on-state current of the transistor can be increased, so that a circuit included in the layer 20 can be driven at high speed. Furthermore, a Si transistor can be formed by micromachining to have a channel length of 3 nm to 10 nm, and thus an accelerator such as CPU or GPU, an application processor, or the like can be provided as well as the arithmetic circuit 40 dedicated to, for example, an artificial neural network (hereinafter referred to as a neural network in some cases) and/or the driver circuit 30.

The driver circuit 30 includes a gate driver circuit, a source driver circuit, or the like, for example. The gate driver circuit, the source driver circuit, or the like can be provided so as to overlap with the display portion 13 and/or the light-receiving portion 14. Therefore, compared with the case where the driver circuit 30 and the display portion 13 are arranged side by side, the width of a non-display region (also referred to as a bezel) in the periphery of the display portion 13 of the display device 10 can be significantly reduced, enabling the display device 10 to have a small size. In the case where the driver circuit 30 is placed in the periphery of the display portion 13 of the display device 10, the gate driver circuit and the source driver circuit are provided collectively in the periphery of the display portion 13. In contrast, the driver circuit 30 can be divided into a plurality of parts and they can be arranged in a region overlapping with the display portion 13.

The arithmetic circuit 40 is a circuit having a function of executing a product-sum operation processing in an artificial neural network. The arithmetic circuit 40 is, for example, a circuit having a function of performing inference processing based on a hierarchical neural network such as a deep neural network (DNN) or a convolutional neural network (CNN), and the detailed structure of the arithmetic circuit 40 will be described in Embodiment 2. The arithmetic circuit 40 can perform a product-sum operation using an ultralow current according to an analog voltage in a cell array CA described later; thus, it can perform arithmetic processing using ultralow currents flowing through the light-receiving devices 62 as input data. Therefore, the arithmetic circuit 40 is effective in reducing the circuit area and power consumption, improving operation efficiency, and the like.

A layer 50 is provided over the layer 20. The layer 50 includes a pixel circuit portion 51P including a plurality of pixel circuits 51 and a cell array CA including a plurality of cells IM. The layer 50 includes transistors 52 each including a metal oxide (also referred to as an oxide transistor) in a channel formation region 54 (the transistors are also referred to as OS transistors). Note that the layer 50 can be stacked over the layer 20. The layer 50 may be formed over another substrate and bonded to the layer 20.

It is preferable that a transistor in which a channel formation region includes an oxide containing at least one of indium, zinc, and an element M (the element M is aluminum, gallium, yttrium, or tin) be used as the transistor 52, which is an OS transistor. Such an OS transistor has a feature of an extremely low off-state current. Thus, it is preferable that OS transistors be used particularly as transistors provided in the pixel circuits 51 and the cells IM, in which case analog data written to the pixel circuits 51 and the cells IM can be retained for a long time.

A layer 60 is provided over the layer 50. The substrate 12 is provided over the layer 60. The substrate 12 is preferably a light-transmitting substrate or a layer formed using a light-transmitting material. The layer 60 includes the display portion 13 provided with a plurality of light-emitting devices 61 and the light-receiving portion 14 provided with a plurality of light-receiving devices 62. The layer 60 can be stacked over the layer 50. As the light-emitting device 61, an organic electroluminescent device (also referred to as an organic EL device) or the like can be used, for example. Note that the light-emitting device 61 is not limited thereto and may be an inorganic EL device formed using an inorganic material, for example. Note that an "organic EL device" and an "inorganic EL device" are collectively referred to as "EL devices" in some cases. The light-emitting device 61 may contain an inorganic compound such as quantum dots. For example, when used for a light-emitting layer, quantum dots can function as a light-emitting material.

As illustrated in FIG. 3A, the display device 10 of one embodiment of the present invention can have a structure in which the light-emitting devices 61, the pixel circuits 51, and the driver circuit 30 are stacked; thus, the aperture ratio (effective display area ratio) of the pixels can be significantly increased. Furthermore, the pixel circuits 51 can be arranged extremely densely, resulting in a significant increase in the resolution of the pixels. The display device 10 has an extremely high resolution and thus can be suitably used for a device for VR such as a head-mounted display or a glasses-type device for AR. For example, even in the case of a structure in which the display portion of the display device 10 is viewed through an optical component such as a lens, pixels of the extremely-high-resolution display portion included in the display device 10 are not seen when the display portion is enlarged by the lens, so that display providing a high sense of immersion can be performed.

Furthermore, the display device 10 can have a structure in which the light-receiving devices 62, the cell array CA, and the arithmetic circuit 40 are stacked as illustrated in FIG. 3A; thus, arithmetic processing excellent in the arithmetic efficiency can be performed using ultralow currents output from the light-receiving devices 62 as input data. In the display device 10, the light-receiving portion 14 can be placed close to the display portion 13; therefore, an image can be viewed by the user's eyes and an image of the user's eyes and/or their surroundings can be captured. Analog data written according to ultralow currents can be retained for a long time in the cells IM of the cell array CA. The arithmetic circuit 40 that performs a product-sum operation processing using ultralow currents can perform an arithmetic operation with excellent arithmetic efficiency.

Figure 3B:
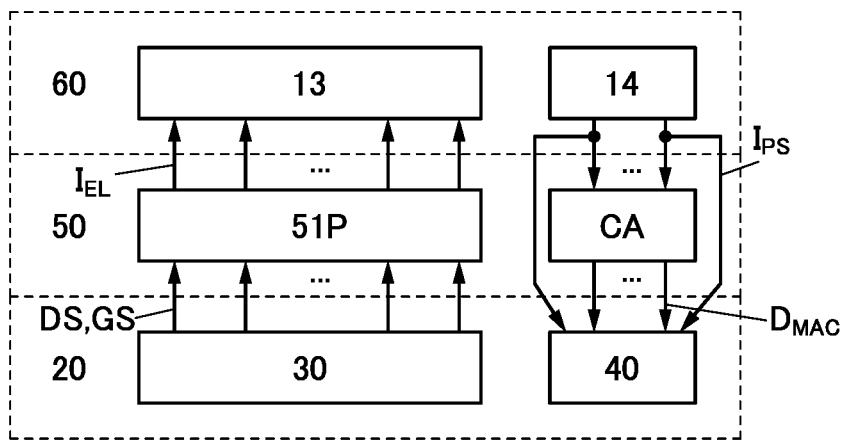

FIG. 3B is a block diagram showing components of each of the layer 20, the layer 50, and the layer 60 in FIG. 3A. The driver circuit 30 in the layer 20 outputs signals GS and DS for controlling the pixel circuit portion 51P in the layer 50 (for example, GS is a signal for driving a gate line, and DS is a signal according to image data). The pixel circuit portion 51P in the layer 50 outputs a current $I_{EL}$ according to image data to the light-emitting devices 61 (not shown) provided in the display portion 13 in the layer 60. The light-emitting devices 61 (not shown) in the display portion 13 in the layer 60 can emit light in accordance with the current $I_{EL}$, so that the user can view an image.

In the block diagram shown in FIG. 3B, the light-receiving devices 62 (not shown) provided in the light-receiving portions 14 in the layer 60 each output a current $I_{PS}$ that flows when an image of the user's eyes and/or their surroundings is captured. The current $I_{PS}$ is output to the cell array CA in the layer 50 and the arithmetic circuit 40 in the layer 20. The cell array CA in the layer 50 outputs signals $D_{MAC}$ according to a product-sum operation to the arithmetic circuit 40 in the layer 20, in accordance with the currents $I_{PS}$ from the light-receiving portions 14 in the layer 60 and a control signal for the arithmetic circuit 40 in the layer 20. The arithmetic circuit 40 in the layer 20 can perform inference processing based on a neural network.

Figure 4A:
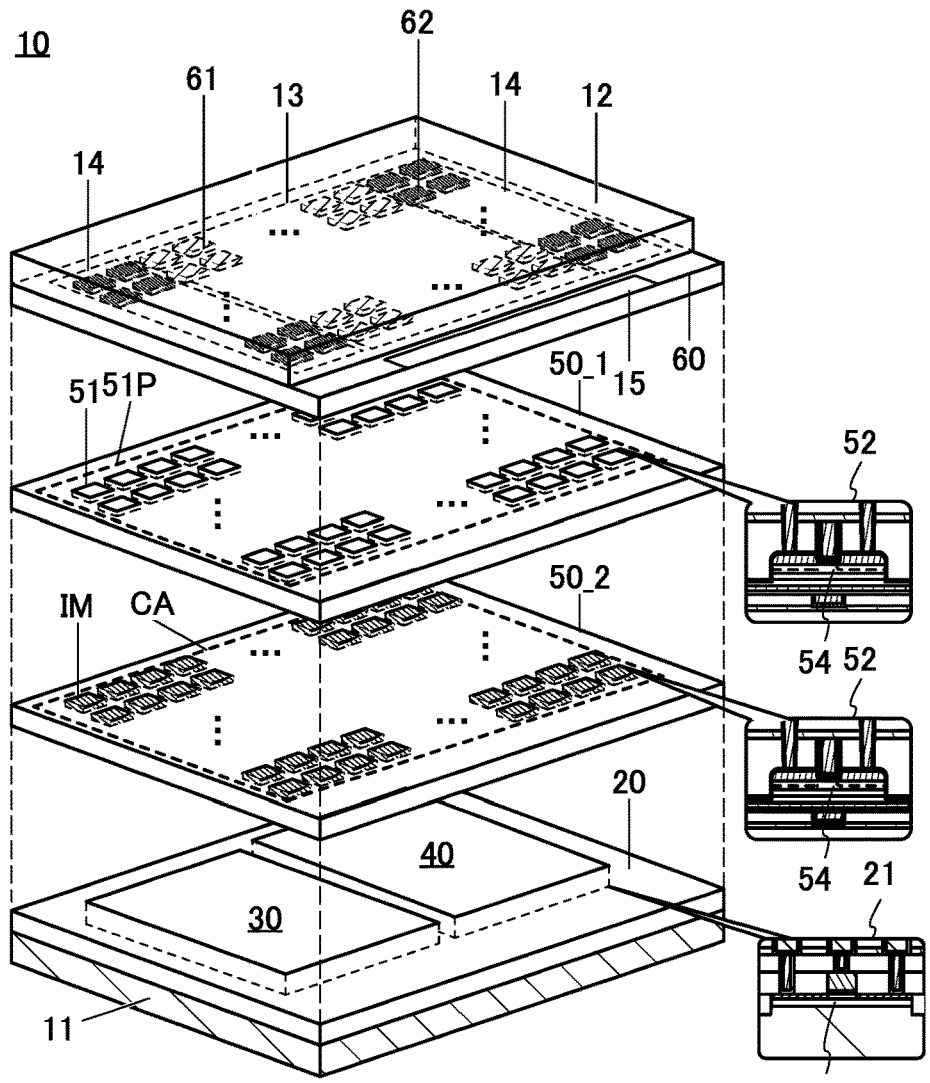
FIGS. 4A and 4B illustrate a structure example of a display device.

The layer 50 provided over the layer 20 can have a structure of two or more layers. For example, the layer 50 can be composed of layers 50_1 and 50_2 including the transistors 52, which are OS transistors, as illustrated in FIG. 4A. In FIG. 4A, the pixel circuit portion 51P including the pixel circuits 51 is provided in the layer 50_1, and the cell array CA including the cells IM is provided in the layer 502.

With such a structure, a region where the pixel circuits 51 and the cells IM can be provided can be increased.

Figure 4B:
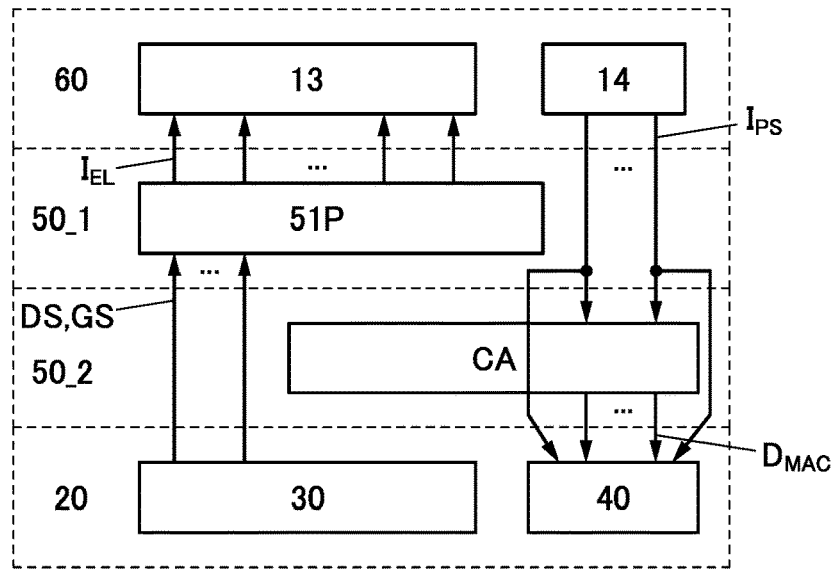

FIG. 4B is a block diagram showing components of each of the layer 20, the layer 501, the layer 502, and the layer 60 in FIG. 4A, as in FIG. 3B. As illustrated in FIG. 4B, the driver circuit 30 in the layer 20 and the pixel circuit portion 51P in the layer 50_1 are electrically connected to each other through the layer 50_2. It is preferable to provide a layer including wirings between the layer 20 and the layer 50_1 and between the layer 50_1 and the layer 502, in which case electrical connection between circuits in different layers is facilitated.

As illustrated in FIG. 4B, the light-receiving portion 14 in the layer 60 is electrically connected to the cell array in the layer 50_2 through the layer 501. It is preferable to provide a layer including wirings between the layer 60 and the layer 50_1 and between the layer 50_1 and the layer 50_2, in which case electrical connection between circuits in different layers is facilitated.

Figure 5A:
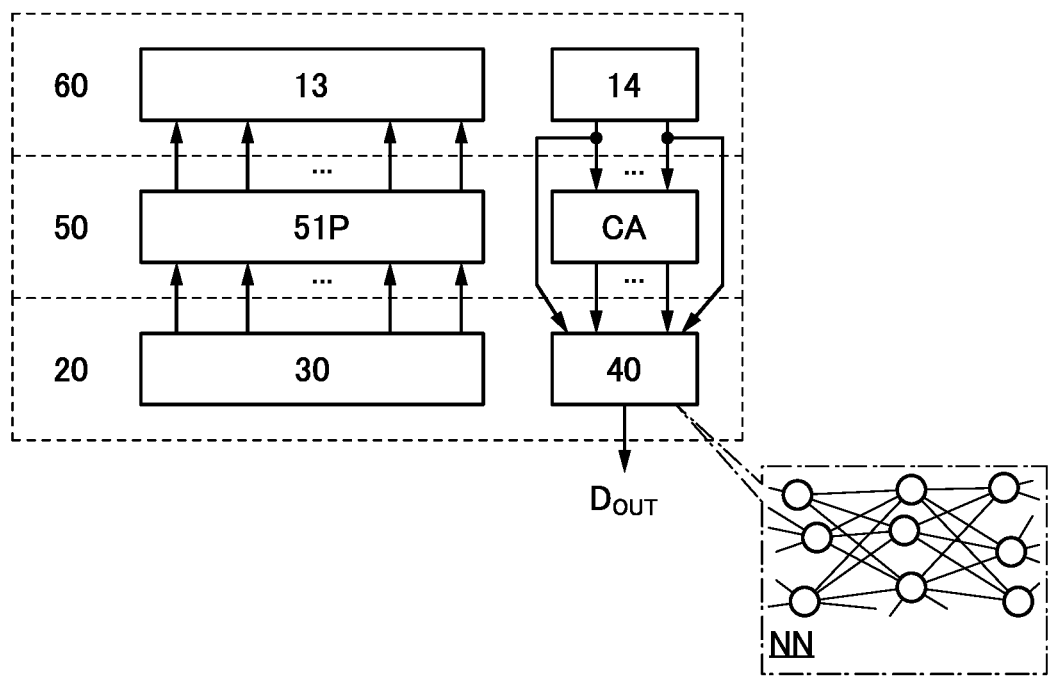
FIGS. 5A and 5B illustrate a structure example of a display device.

The arithmetic circuit 40 in the layer 20 can perform inference processing based on a neural network. FIG. 5A illustrates output data $D_{OUT}$ output when the arithmetic circuit 40 performs inference processing based on a neural network NN included in the arithmetic circuit 40 in the block diagram in FIG. 3B.

Figure 5B:
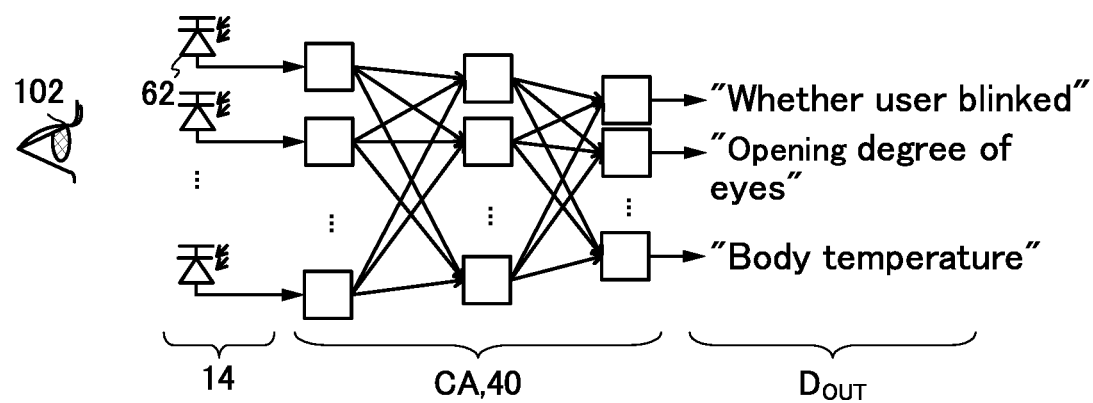

An example of inference processing in the neural network NN will be described with reference to FIG. 5B. The arithmetic circuit 40 that can perform arithmetic processing based on the neural network NN uses, as input data, ultralow currents that flow through the light-receiving devices 62 when the light-receiving devices 62 in the light-receiving portion 14 each capture an image of the eyes 102 of the user and their surroundings. The arithmetic circuit 40 and the cell array CA perform a product-sum operation using the input data, weight data retained in the cells IM, and the like and executes arithmetic processing based on the neural network. As the output data $D_{OUT}$ obtained in the arithmetic circuit 40, for example, "whether the user blinked", "the opening degree of the user's eyes", or "the user's body temperature" can be inferred from the eyes 102 of the user and their surroundings.

As described above, the display device of one embodiment of the present invention can have a structure in which light-emitting devices, pixel circuits, and a driver circuit are stacked. The driver circuit, which is a peripheral circuit, can be provided so as to overlap with the pixel circuits and thus the width of the bezel can be made extremely small, so that a reduction in size and weight of the display device can be achieved. Thus, excellent wearability of the electronic device of one embodiment of the present invention can be achieved.

A structure of the display device of one embodiment of the present invention in which circuits are stacked enables its wirings connecting the circuits to be shortened, resulting in a reduction in weight of the display device. The display device of one embodiment of the present invention can be a display portion with a high pixel resolution. Thus, an electronic device including the display device can have excellent display quality.

The display device of one embodiment of the present invention can have a structure in which light-receiving devices, a cell array, and an arithmetic circuit are stacked. The light-receiving devices can be placed close to the cell array and the arithmetic circuit; thus, ultralow currents output from the light-receiving devices can be used as input data. The arithmetic circuit and the cell array can perform arithmetic processing with excellent arithmetic efficiently. In an electronic device including the display device of one embodiment of the present invention, the light-receiving portion can be placed close to the display portion; therefore, an image can be viewed by the user's eyes and an image of the user's eyes and/or their surroundings can be captured. Analog data written according to ultralow currents can be retained for a long time in the cell array in the display device. An arithmetic circuit that performs a product-sum operation processing using ultralow currents can perform an arithmetic operation with excellent arithmetic efficiency.

Other Structure Examples of Electronic Device

Figure 6A:
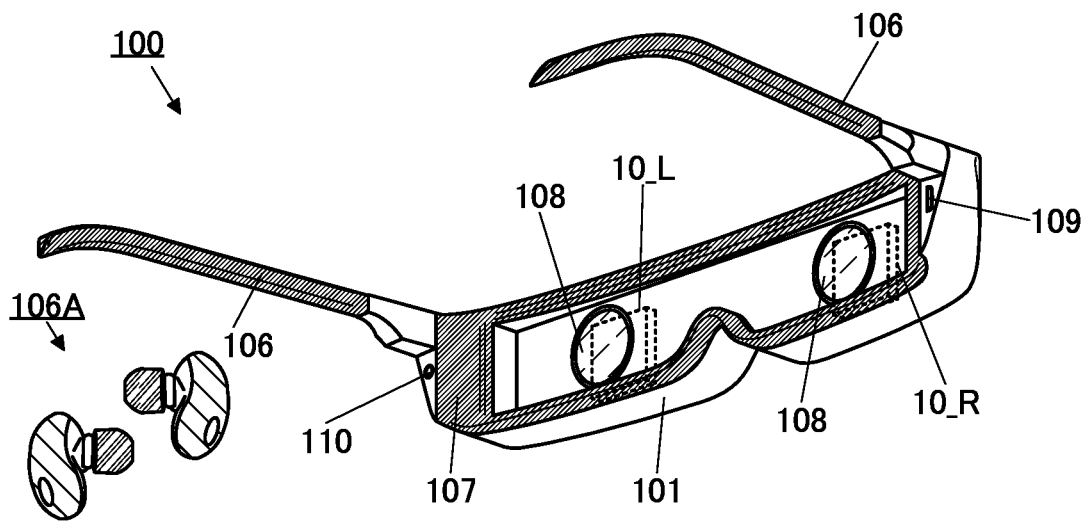
FIGS. 6A and 6B each illustrate a structure example of an electronic device.

FIG. 6A is a perspective view illustrating the back surface, the bottom surface, and the right side surface of the electronic device 100 illustrated in FIG. 1A.

In FIG. 6A, the housing 101 of the electronic device 100 includes, for example, a mounting portion 106, a cushion 107, a pair of lenses 108, and the like, as well as the pair of display devices 10_L and 10_R. The display portion 13 in each of the pair of display devices 10_L and 10_R is provided at a position where the display portion 13 can be viewed through the lens 108 inside the housing 101.

The light-receiving portion 14 in each of the pair of display devices 10_L and 10_R is provided at a position where data on the eyes 102 of the user and their surroundings can be acquired. The acquirement of data on the eyes 102 of the user and their surroundings in the light-receiving portion 14 can be performed either through the lenses 108 inside the housing 101 or without the lenses 108.

In addition, an input terminal 109 and an output terminal 110 are provided in the housing 101 illustrated in FIG. 6A. To the input terminal 109, a cable for supplying an image signal (image data) from a video output device or the like, power for charging a battery provided in the housing 101, or the like can be connected. The output terminal 110 can function as, for example, an audio output terminal to which earphones, headphones, or the like can be connected.

In addition, the housing 101 preferably includes a mechanism by which the right and left positions of the lenses 108 and the display devices 10_L and 10_R can be adjusted to the optimal positions in accordance with the positions of the user's eyes. The housing 101 preferably includes a mechanism for adjusting focus by changing the distance between the lenses 108 and the display devices 10_L and 10_R.

The cushion 107 is in contact with the user's face (forehead, cheek, or the like). This can prevent light leakage, which increases the sense of immersion. A soft material is preferably used for the cushion 107 so that the cushion 107 is in close contact with the user's face when the user wears the electronic device 100. Furthermore, using such a material is preferable because it provides a soft texture and the user does not feel cold when wearing the electronic device in a cold season, for example. A member in contact with user's skin, such as the cushion 107 or the mounting portion 106, is preferably detachable because cleaning or replacement can be easily performed.

The electronic device of one embodiment of the present invention may further include earphones 106A. The earphones 106A include a communication portion (not illustrated) and has a wireless communication function. The earphones 106A can output audio data with the wireless communication function. The earphones 106A may include a vibration mechanism to function as bone-conduction earphones.

Figure 6B:
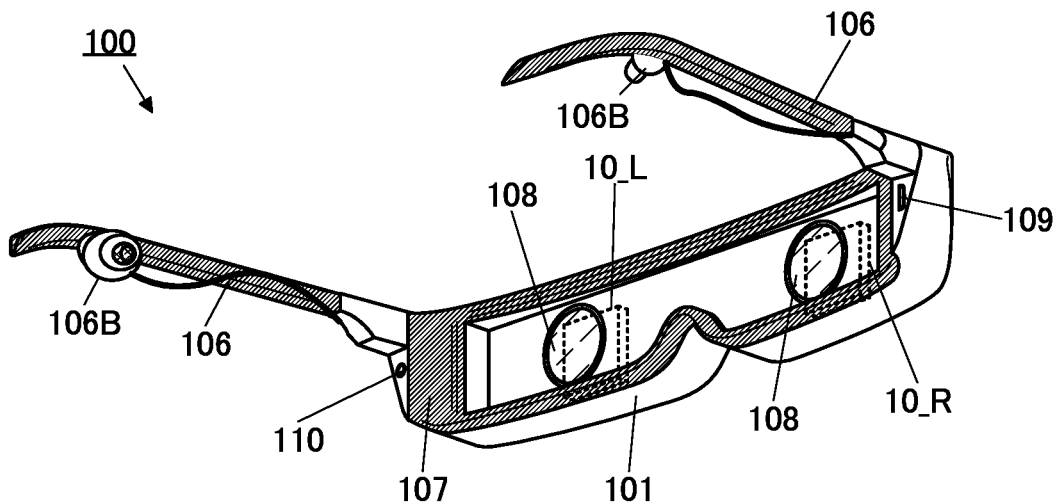

The earphones 106A can be directly connected to or connected with wire to the mounting portion 106 like earphones 106B illustrated in FIG. 6B. The earphones 106B and the mounting portion 106 may each have a magnet. This is preferred because the earphones 106B can be fixed to the mounting portion 106 with magnetic force and thus can be easily housed.

Figure 7A:
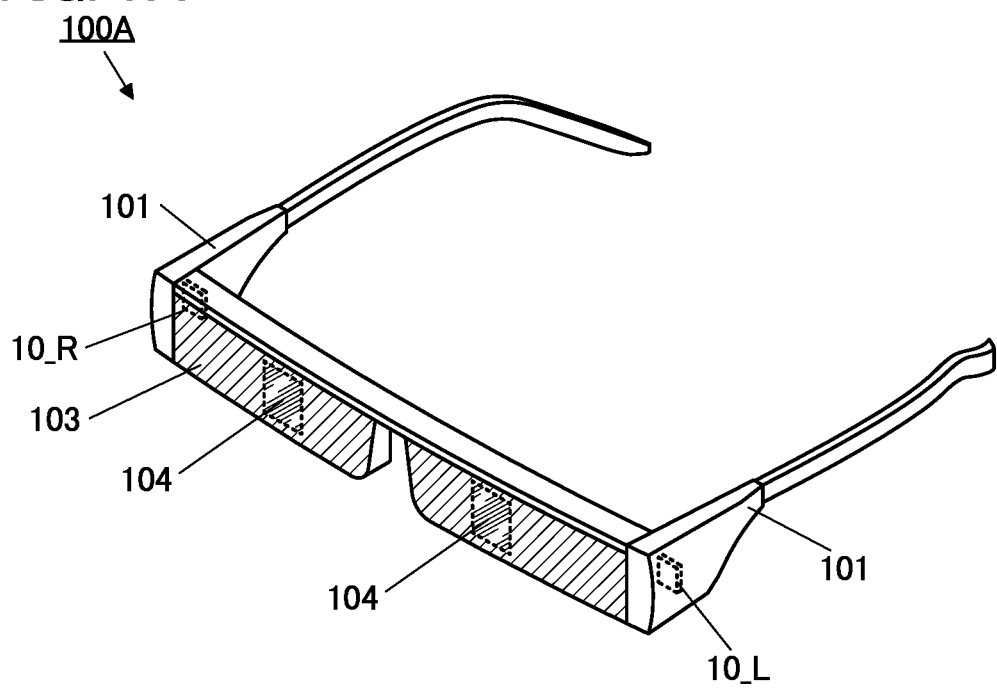
FIGS. 7A and 7B illustrate a structure example of a display device.

FIG. 7A is a perspective view of a glasses-type electronic device 100A as another example of a wearable electronic device. In the electronic device 100A in FIG. 7A, the pair of display devices 10_L and 10_R is provided in the housings 101.

The electronic device 100A can project images displayed on the display portions 13 of the display devices 10_L and 10_R in display regions 104 of the optical components 103. Since the optical components 103 have a light-transmitting property, a user can see images displayed on the display regions 104, which are superimposed on transmission images seen through the optical components 103. Thus, the electronic device 100A is an electronic device capable of AR display.

Although not illustrated, the housings 101 are provided with a wireless receiver or a connector to which a cable can be connected, whereby a video signal or the like can be supplied to the housings 101. Furthermore, when the housings 101 are provided with an acceleration sensor such as a gyroscope sensor, the orientation of the user's head can be sensed and an image according to the orientation can be displayed on the display region 104.

Next, a method for projecting an image on the display region 104 of the electronic device 100A will be described with reference to FIG. 7B. The display device 10, a lens 111, and a reflective plate 112 are provided inside the housing 101. A reflective surface 113 functioning as a half mirror is provided as a portion corresponding to the display region 104 of the optical component 103.

Light 115 emitted from the display device 10 passes through the lens 111 and is reflected by the reflective plate 112 toward the optical component 103. In the optical component 103, the light 115 is fully reflected repeatedly by end surfaces of the optical component 103 and reaches the reflective surface 113, whereby an image is projected on the reflective surface 113. Accordingly, the user can see both the light 115 reflected by the reflective surface 113 and transmitted light 116 transmitted through the optical component 103 (including the reflective surface 113).

Figure 7B:
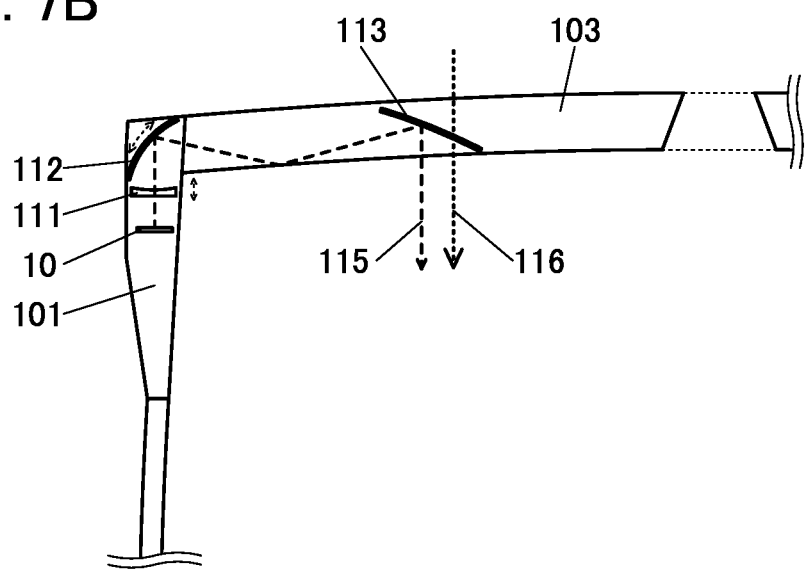

FIG. 7B shows an example in which the reflective plate 112 and the reflective surface 113 each have a curved surface. This can increase optical design flexibility and reduce the thickness of the optical component 103, compared to the case where they have flat surfaces. Note that the reflective plate 112 and the reflective surface 113 may be flat.

For the reflective plate 112, a component having a mirror surface can be used, and the reflective plate 112 preferably has high reflectivity. As the reflective surface 113, a half mirror utilizing reflection of a metal film may be used, but the use of prism or the like utilizing total reflection can increase the transmittance of the transmitted light 116.

Here, the housing 101 preferably includes a mechanism for adjusting the distance or angle between the lens 111 and the display device 10. This enables focus adjustment and zooming in/out of images. One or both of the lens 111 and the display device 10 are preferably movable in the optical-axis direction, for example.

The housing 101 preferably includes a mechanism capable of adjusting the angle of the reflective plate 112. The position of the display region 104 where images are displayed can be changed by changing the angle of the reflective plate 112. Thus, the display region 104 can be placed at the most appropriate position in accordance with the position of the user's eye.

At least part of any of the structure examples, the drawings corresponding thereto, and the like described in this embodiment can be implemented in combination with any of the other structure examples, the other drawings corresponding thereto, and the like as appropriate.

Embodiment 2

An arithmetic circuit included in the display device of one embodiment of the present invention will be described. The arithmetic circuit can be used for arithmetic processing in an artificial neural network. As the artificial neural network, a hierarchical neural network can be used, for example.

<Hierarchical Neural Network>

Figure 8A:
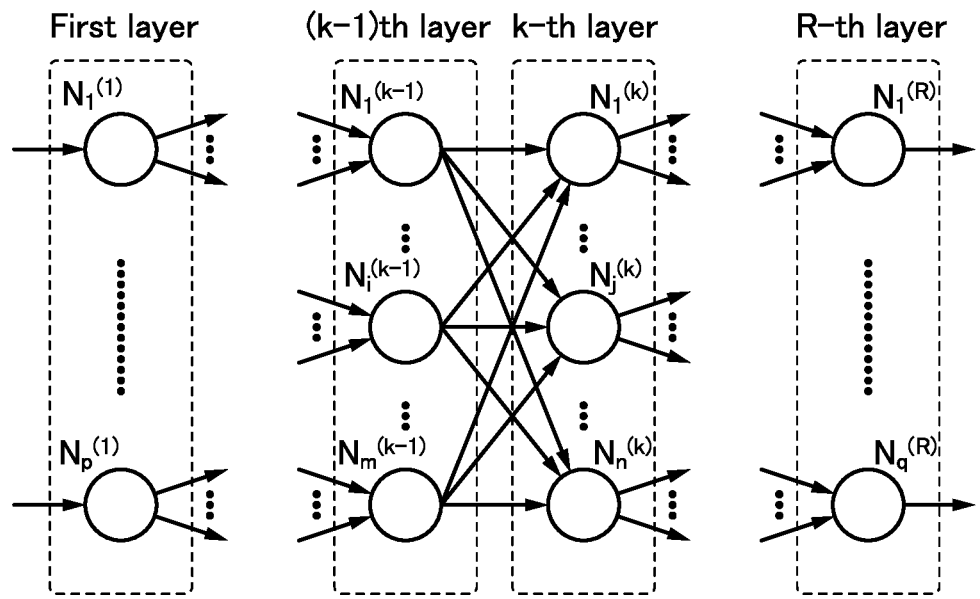
FIGS. 8A and 8B illustrate a structure example of a neural network.

A hierarchical neural network is composed of three or more layers of one input layer, one or more intermediate layers (hidden layers), and one output layer, for example. FIG. 8A illustrates an example of a hierarchical neural network ANN, and the neural network ANN includes first to R-th layers (here, R is an integer greater than or equal to 4). Specifically, the first layer is the input layer, the R-th layer is the output layer, and the other layers are the intermediate layers. FIG. 8A illustrates the (k−1)th layer and the k-th layer (here, k is an integer greater than or equal to 3 and less than or equal to R−1) as the intermediate layers, and does not show the other intermediate layers.

Each of the layers of the neural network ANN includes one or more neurons. In FIG. 8A, the first layer includes neurons $N_1^{(1)}$ to $N_p^{(1)}$ (here, p is an integer greater than or equal to 1). The (k−1)th layer includes neurons $N_1^{(k-1)}$ to $N_m^{(k-1)}$ (here, m is an integer greater than or equal to 1). The k-th layer includes neurons $N_1^{(k)}$ to $N_n^{(k)}$ (here, n is an integer greater than or equal to 1). The R-th layer includes neurons $N_1^{(R)}$ to $N_q^{(R)}$ (here, q is an integer greater than or equal to 1).

FIG. 8A illustrates, in addition to the neurons $N_1^{(1)}$, $N_p^{(1)}$, $N_1^{(k-1)}$, $N_m^{(k-1)}$, $N_1^{(k)}$, $N_n^{(k)}$, $N_1^{(R)}$, and $N_q^{(R)}$, a neuron $N_i^{(k-1)}$ (here, i is an integer greater than or equal to 1 and less than or equal to m) in the (k−1)th layer and a neuron $N_j^{(k)}$ (here, j is an integer greater than or equal to 1 and less than or equal to n) in the k-th layer; the other neurons are not illustrated.

Next, signal transmission from a neuron in one layer to a neuron in the next layer and signals input to and output from neurons will be described. The description here is made with a focus on the neuron $N_j^{(k)}$ in the k-th layer.

Figure 8B:
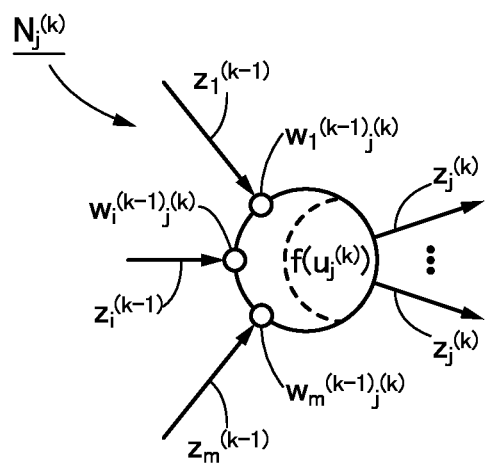

FIG. 8B illustrates the neuron $N_j^{(k)}$ in the k-th layer, signals input to the neuron $N_j^{(k)}$, and signals output from the neuron $N_j^{(k)}$. FIG. 8B also illustrates weight data $w_1^{(k-1)}{}_j^{(k)}$, $w_i^{(k-1)}{}_j^{(k)}$, and $w_m^{(k-1)}{}_j^{(k)}$ between the (k−1)th layer and the k-th layer, and an activation function $f(u_j^{(k)})$.

Specifically, output signals $z_1^{(k-1)}$ to $z_m^{(k-1)}$ from the neurons $N_1^{(k-1)}$ to $N_m^{(k-1)}$ in the (k−1)th layer are output to the neuron $N_j^{(k)}$. Then, the neuron $N_j^{(k)}$ generates output signals $z_j^{(k)}$ in response to the signals $z_1^{(k-1)}$ to $z_m^{(k-1)}$, and outputs the output signals $z_j^{(k)}$ to the neurons in the (k+1)th layer (not illustrated).

Configuration Example 1 of Arithmetic Circuit

Next, a configuration example of an arithmetic circuit 40_1 that can be used in the hierarchical neural network described above will be described. The arithmetic circuit 40_1 can be used as the arithmetic circuit 40 described in the above embodiment.

Figure 9:
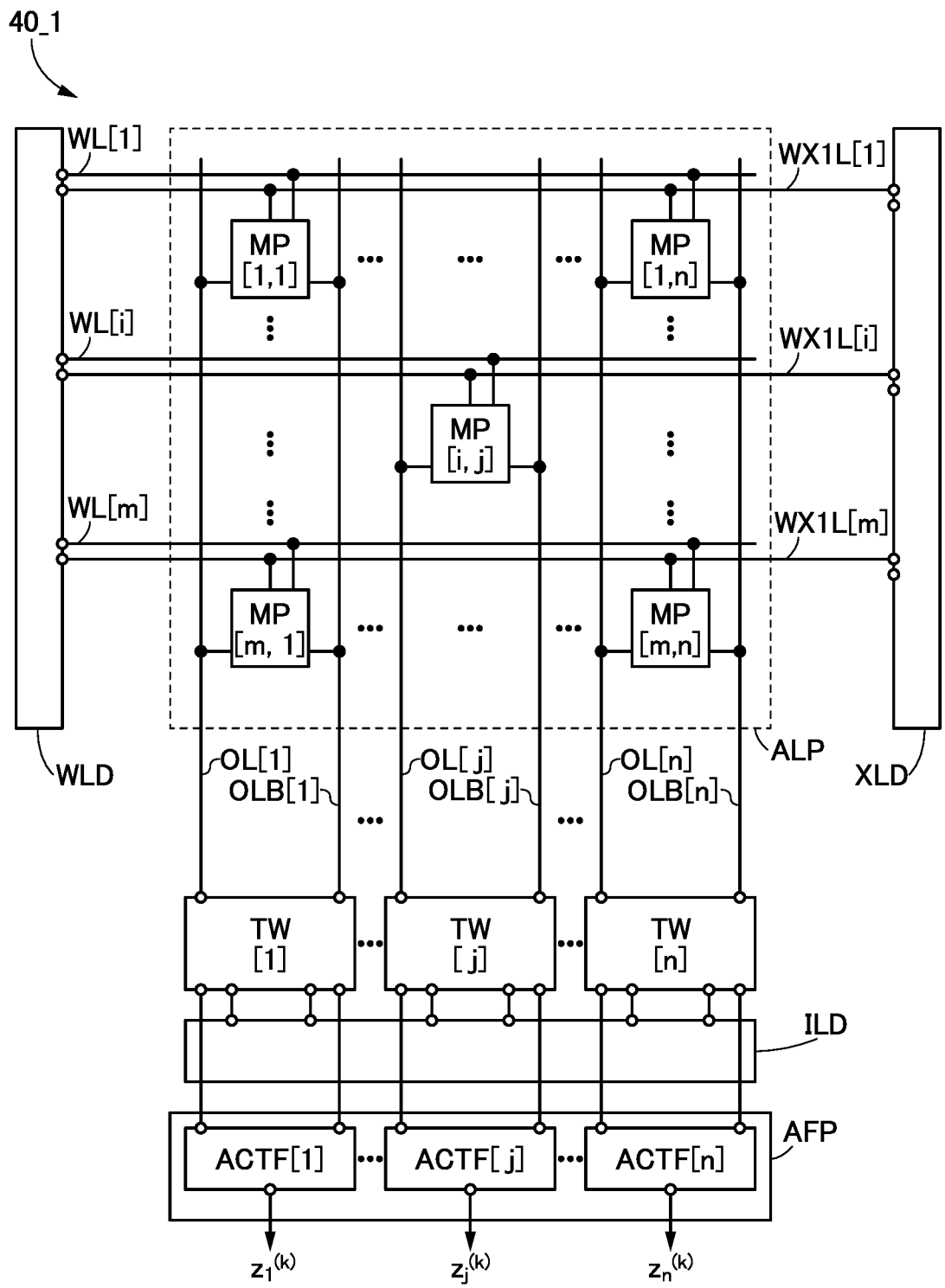
FIG. 9 illustrates a configuration example of a display device.

The arithmetic circuit 40_1 in FIG. 9 includes an array portion ALP, a circuit ILD, a circuit WLD, a circuit XLD, a circuit AFP, and circuits TW[1] to TW[n], for example.

The circuit ILD and the circuit AFP are electrically connected to the wirings OL[1] to OL[n] and wirings OLB[1] to OLB[n] through the circuits TW[1] to TW[n].

The circuits TW[1] to TW[n] function as switching circuits. In the circuits TW[1] to TW[n], switching between inputting output signals of the wirings OL[1] to OL[n] and wirings OLB[1] to OLB[n] to the circuit AFP and inputting output signals of the circuit ILD to the wirings OL[1] to OL[n] and the wirings OLB[1] to OLB[n] can be performed.

The circuit WLD is electrically connected to wirings WL[1] to WL[m] and wirings WX1L[1] to WX1L[m]. The circuit XLD is electrically connected to the wirings WX1L[1] to WX1L[m].

The arithmetic circuit 40_1 in FIG. 9 includes an array portion ALP in which circuits MP are arranged in a matrix of m×n. In FIG. 9, a circuit MP[i, j] represents the circuit MP in the i-th row and the j-th column (here, i is an integer greater than or equal to 1 and less than or equal to m, and j is an integer greater than or equal to 1 and less than or equal to n). Note that FIG. 9 illustrates only circuits MP[1, 1], MP[1, m], MP[i, j], MP[n, 1], and MP[n, m] and does not illustrate the other circuits MP.

The circuit MP[i, j] is electrically connected to the wiring WL[i], the wiring WX1L[i], the wiring OL[j], and the wiring OLB[j].

The circuit MP[i,j] has a function of retaining a weight coefficient (also referred to as first data), for example. The weight coefficient is also referred to as a weighted value. Specifically, the circuit MP[i,j] retains data according to a weight coefficient input from the wiring OL[j] and the wiring OLB[j].

The circuit ILD has a function of outputting data corresponding to the first data, which is a weight coefficient, to the wirings OL[1] to OL[n] and the wirings OLB[1] to OLB[n].

As the data corresponding to a weight coefficient, a potential, a resistance, a current value, or the like can be used, for example. In the case where a current value is used as data corresponding to a weight coefficient, a current to be input can be generated using a current digital-to-analog converter (IDAC).

The circuit MP [i, j] has a function of outputting the product of an input value input from the wiring WX1L[i] (also referred to as second data) and a weight coefficient (first data). For a specific example, the circuit MP [i,j] outputs a current corresponding to the product of the first data and the second data to the wiring OL[j] and the wiring OLB[j] when the second data is input to the circuit MP [i, j] from the wiring WX1L[i]. Note that although FIG. 9 illustrates the example in which the wiring OL[j] and the wiring OLB[j] are provided, one embodiment of the present invention is not limited thereto. Only one of the wiring OL[j] and the wiring OLB[j] may be provided.

The circuit XLD has a function of supplying the second data, which is an input value, to the wirings WX1L[1] to WX1L[m].

Data corresponding to the input value can be, for example, a potential, a current value, or the like. In the case where a current value is used as data corresponding to an input value, a current to be input can be generated using the IDAC.

Currents corresponding to the products of the first data and the second data output from the circuits MP[1, j] to MP[m, j] are added and the sum of the currents is output to the wiring OL[j] and the wiring OLB[j]. In this manner, the arithmetic circuit can perform a product-sum operation with the weight coefficients and the input values.

The circuit XLD and the circuit WLD each have a function of selecting the circuit MP to which data corresponding to the first data input from the circuit ILD is to be written. In the case where data is written to the circuits MP[i, 1] to MP[i, n] positioned in the i-th row of the array portion ALP, the circuit XLD supplies, to the wiring WX1L[i], a signal for turning on or off writing switching elements included in the circuits MP[i, 1] to MP[i, n], and supplies, to the other wirings WX1L, a potential for turning off writing switching elements included in the circuits MP in rows other than the i-th row, for example. In addition, the circuit WLD supplies, to the wiring WL[i], a signal for turning on or off the writing switching elements included in the circuits MP[i, 1] to MP[i, n], and supplies, to the other wirings WL, a signal for turning off the writing switching elements included in the circuits MP in rows other than the i-th row, for example.

The circuit AFP includes circuits ACTF[1] to ACTF[n]. The circuit ACTF[j] is electrically connected to the wiring OL[j] and the wiring OLB[j] through a circuit TW[j] having a switching function. The circuit ACTF[j] can generate a signal corresponding to data (e.g., a potential or a current value) according to the results of product-sum operations that are input from the wiring OL[j] and the wiring OLB[j] and output the signal as $z_j^{(k)}$. The circuit AFP can compare data (e.g., a potential or a current value) according to the results of product-sum operations that are input from the wiring OL[j] and the wiring OLB[j], generate a signal according to the comparison result, and output the signal as $z_j^{(k)}$.

<Circuit MP>

Figure 10:
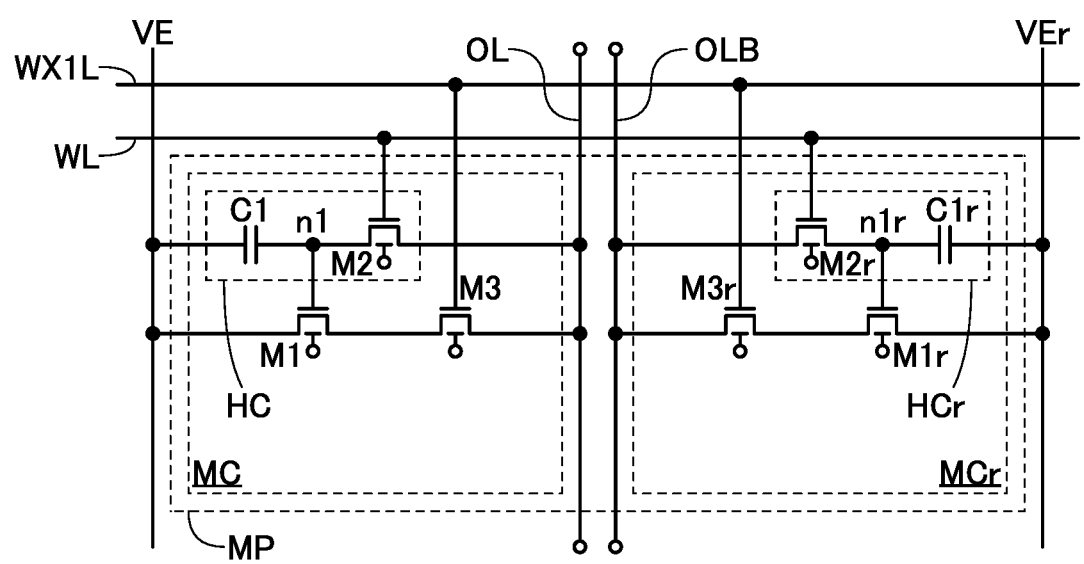
FIG. 10 illustrates a configuration example of a display device.

Next, the circuit MP will be described. FIG. 10 illustrates a circuit configuration example that can be used for the circuit MP[i,j]. The circuit MP includes transistors M1 to M3 and a capacitor C1. For example, the holding portion HC is composed of the transistor M2 and the capacitor C1.

In the circuit MP in FIG. 10, a circuit MCr has substantially the same circuit configuration as the circuit MC. Thus, "r" is added to the reference numerals of the circuit elements and the like included in the circuit MCr to differentiate them from the circuit elements and the like included in the circuit MC.

The transistors M1 to M3 illustrated in FIG. 10 are each an n-channel transistor having a multi-gate structure including gates over and under a channel, and the transistors M1 to M3 each include a first gate and a second gate.

The arithmetic circuit 40_1 described in this embodiment does not depend on the connection structure of the back gate of a transistor. In FIG. 10, the back gates of the transistors M1 to M3 are illustrated. The connection structures of the back gates are not illustrated, and the destinations to which the back gates are electrically connected can be determined at the design stage. For example, in a transistor including a back gate, a gate and the back gate may be electrically connected to each other to increase the on-state current of the transistor.

In the circuit MP in FIG. 10, a first terminal of the transistor M1 is electrically connected to a wiring VE. A second terminal of the transistor M1 is electrically connected to a first terminal of the transistor M3. A gate of the transistor M1 is electrically connected to a first terminal of the capacitor C1 and a first terminal of the transistor M2. A second terminal of the capacitor C1 is electrically connected to the wiring VE. A second terminal of the transistor M2 is electrically connected to a wiring OL. A gate of the transistor M2 is electrically connected to the wiring WL. A second terminal of the transistor M3 is electrically connected to the wiring OL and a gate of the transistor M3 is electrically connected to the wiring WX1L.

The connection structure of the circuit MCr different from that of the circuit MC will be described. A second terminal of a transistor M3r is electrically connected to not the wiring OL but the wiring OLB. A first terminal of a transistor M1r and a first terminal of a capacitor C1r are electrically connected to a wiring VEr.

Note that in the holding portion HC illustrated in FIG. 10, an electrical connection point of the gate of the transistor M1, the first terminal of the capacitor C1, and the first terminal of the transistor M2 is a node n1.

The holding portion HC has a function of holding a potential corresponding to a weight coefficient (first data). The potential can be held in the holding portion HC included in the circuit MC in FIG. 10 in the following manner: when the transistor M2 and the transistor M3 are turned on, a current with a predetermined value is input from the wiring OL to the capacitor C1 so that a potential corresponding to the current value is written thereto, and then the transistor M2 is turned off. Thus, the potential of the node n1 can be held as the potential corresponding to the weight coefficient (first data). Therefore, the input of the first data is less likely to be adversely affected by variations in current characteristics (e.g., threshold voltage) of the transistor M1.

The current input to the wiring OL can be input and generated using the IDAC.

As the transistor M1, a transistor with a low off-state current is preferably used for a long-term holding of the potential of the node n1. As the transistor with a low off-state current, an OS transistor can be used, for example. Alternatively, a transistor including a back gate may be used as the transistor M1, and an off-state current may be reduced by applying a low-level potential to the back gate to shift the threshold voltage to the positive side.

Thus, an arithmetic circuit with high arithmetic operation accuracy is provided.

Configuration Example 2 of Arithmetic Circuit

An arithmetic circuit 40_2 that performs a product-sum operation will be described as another example. The arithmetic circuit 40_2 can be used for the arithmetic circuit 40 described in the above embodiment.

Figure 11:
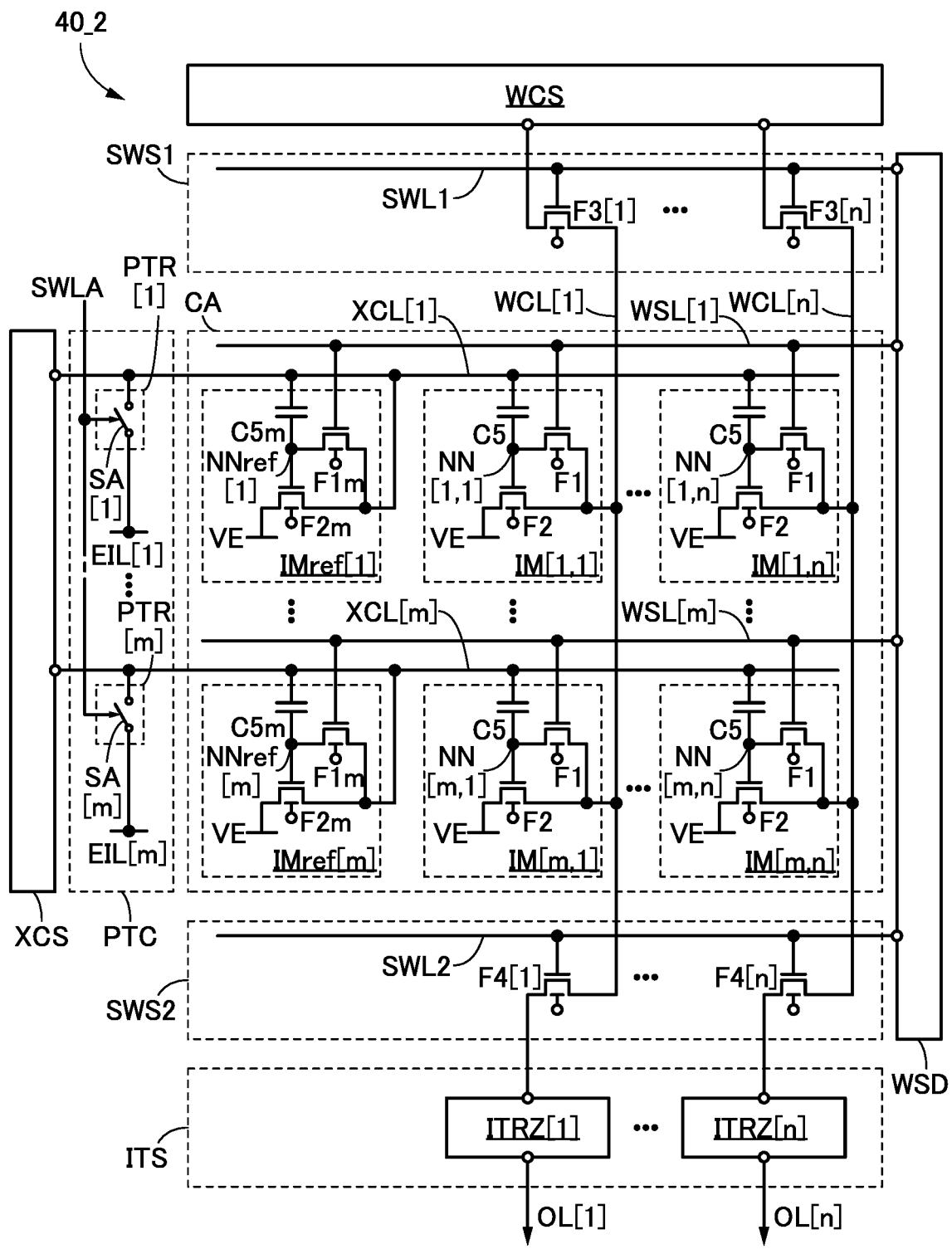
FIG. 11 illustrates a configuration example of a display device.

FIG. 11 shows a configuration example of an arithmetic circuit which performs a product-sum operation of positive or "0" first data and positive or "0" second data. An arithmetic circuit 40_2 illustrated in FIG. 11 is a circuit that performs product-sum operation of the first data corresponding to a potential stored in each cell and the input second data, and performs arithmetic operation of an activation function using the result of the product-sum operation. Note that the first data and the second data can be analog data or multilevel data (discrete data), for example.

The arithmetic circuit 40_2, which also functions as a memory for retaining the first data, can be referred to as a memory. In particular, in the case where analog data is used as the first data, the arithmetic circuit 40_2 can be referred to as an analog memory.

The arithmetic circuit 40_2 includes a circuit WCS, a circuit XCS, a circuit WSD, a circuit PTC, a circuit SWS1, a circuit SWS2, a cell array CA, and a circuit ITS.

The circuit PTC includes circuits PTR[1] to PTR[m]. The circuits PTR[1] to PTR[m] have a function of establishing or breaking electrical continuity between the wirings EIL[1] to EIL[m] and the wirings XCL[1] to XCL[m]. That is, the circuits PTR[1] to PTR[m] each function as a switching element. The circuits PTR[1] to PTR[m] each include switches SA[1] to SA[m], for example.

The cell array CA includes cells IM[1, 1] to IM[m, n] (here, m is an integer greater than or equal to 1 and n is an integer greater than or equal to 1) and cells IMref[1] to IMref[m]. The cells IM[1, 1] to IM[m, n] have a function of storing a potential corresponding to the current amount corresponding to the first data, and the cells IMref[1] to IMref[m] have a function of supplying a potential corresponding to the second data required for performing a product-sum operation with the stored potential to the wirings XCL[1] to XCL[m], respectively.

Although cells are arranged in a matrix of n+1 rows and m columns in the cell array CA in FIG. 11, cells may be arranged in a matrix of two or more rows and one or more columns in the cell array CA.

The cells IM[1, 1] to IM[m, n] each include a transistor F1, a transistor F2, and a capacitor C5, and the cells IMref[1] to IMref[m] each include a transistor F1m, a transistor F2m, and a capacitor C5m, for example.

In particular, the sizes of the transistors F1 (e.g., channel length, channel width, and transistor structure) included in the cells IM[1, 1] to IM[m, n] are preferably equal to each other, and the sizes of the transistors F2 included in the cells IM[1, 1] to IM[m, n] are preferably equal to each other. The sizes of the transistors F1m included in the cells IMref[1] to IMref[m] are preferably equal to each other, and the sizes of the transistors F2m included in the cells IMref[1] to IMref[m] are preferably equal to each other. The size of the transistor F1 is preferably equal to that of the transistor F1m, and the size of the transistor F2 is preferably equal to that of the transistor F2m.

Unless otherwise specified, the transistor F1 and the transistor F1m in an on state may operate in a linear region in the end. In other words, the gate voltage, the source voltage, and the drain voltage of each of the transistors may be biased appropriately so that the transistors operate in the linear region. Note that one embodiment of the present invention is not limited thereto. For example, the transistor F1 and the transistor F1m in an on state may operate in a saturation region or may operate both in a linear region and a saturation region.

Unless otherwise specified, the transistor F2 and the transistor F2m may operate in a subthreshold region (i.e., a voltage between the gate and the source of the transistor F2 or the transistor F2m may be lower than the threshold voltage, preferably a drain voltage exponentially increases with respect to the voltage between the gate and the source). In other words, the gate voltage, the source voltage, and the drain voltage of each of the transistors may be biased appropriately so that the transistors operate in the subthreshold region. Thus, the transistors F2 and the transistor F2m may operate such that an off-state current flows between the source and the drain.

The transistor F1 and/or the transistor F1m is preferably an OS transistor, for example. Further preferably, a channel formation region of the transistor F1 and/or the transistor F1m is an oxide containing at least one of indium, zinc, and an element M (examples of the element M include one element or two or more elements selected from aluminum, gallium, yttrium, tin, and other elements).

With the use of an OS transistor as the transistor F1 and/or the transistor F1m, the leakage current of the transistor F1 and/or the transistor F1m can be suppressed, so that the power consumption of the arithmetic circuit can be reduced. Specifically, in the case where the transistor F1 and/or the transistor F1m are/is in an off state, the amount of leakage current from a retention node to a write word line can be extremely small; thus the frequency of refresh operation for the potential at the retention node can be reduced, leading to a reduction in power consumption of the product-sum operation circuit. By making a leakage current from the retention node to the write word line extremely small, cells can store the potential of the retention node for a long time, so that the arithmetic operation accuracy of the arithmetic circuit can be increased.

The use of an OS transistor also as the transistor F2 and/or the transistor F2m enables operation with a wide range of current in the subthreshold region, leading to a reduction in the current consumption. The use of an OS transistor also as the transistor F2 and/or the transistor F2m allows the transistor F2 and/or the transistor F2m to be formed concurrently with the transistor F1 and/or the transistor F1m, leading to a reduction in the number of manufacturing steps for the product-sum operation circuit, in some cases. The transistor F2 and/or the transistor F2m can be, other than an OS transistor, a transistor including silicon in its channel formation region (hereinafter referred to as a Si transistor). As the silicon, amorphous silicon (referred to as hydrogenated amorphous silicon in some cases), microcrystalline silicon, polycrystalline silicon, single crystal silicon, or the like can be used, for example.

When an arithmetic circuit or the like is highly integrated into a chip or the like, the chip may have heat when the circuit operates. This heat makes the temperature of a transistor rise to change the characteristics of the transistor and the field-effect mobility thereof might change or the operation frequency thereof might decrease. Since an OS transistor has a higher heat resistance than a Si transistor, a change in the field-effect mobility and a decrease in the operation frequency due to a change in temperature are less likely to be caused. Even when an OS transistor has a high temperature, it is likely to keep a property of the drain current increasing exponentially with respect to a gate-source voltage. Thus, with the use of an OS transistor, even in a high temperature environment, an product-sum operation described later can be easily performed. To fabricate an arithmetic circuit highly resistant to heat generated by its operation, an OS transistor is preferably used as its transistor.

In each of the cells IM[1, 1] to IM[m, n], a first terminal of the transistor F1 is electrically connected to the gate of the transistor F2. A first terminal of the transistor F2 is electrically connected to the wiring VE. A first terminal of the capacitor C5 is electrically connected to the gate of the transistor F2.

In each of the cells IMref[1] to IMref[m], a first terminal of the transistor F1m is electrically connected to the gate of the transistor F2m. A first terminal of the transistor F2m is electrically connected to the wiring VE. A first terminal of the capacitor C5m is electrically connected to the gate of the transistor F2m.

The arithmetic circuit described in this embodiment does not depend on the polarity of transistors included in the arithmetic circuit. For example, the transistor F1 and the transistor F2 illustrated in FIG. 11 are n-channel transistors; however, some transistors or all transistors may be p-channel transistors.

The above-described examples of changes in the structure and the polarity of the transistor are not limited to the transistor F1 and the transistor F2. For example, the structures and the polarities of the transistor F1m and the transistor F2m, transistors F3[1] to F3[n] and transistors F4[1] to F4[n] which will be described later, a transistor described in other parts of the specification, and a transistor illustrated in other drawings can be changed.

The wiring VE functions as a wiring for supplying a current between the first terminal and a second terminal of the transistor F2 of each of the cell IM[1, 1], the cell IM[m, 1], the cell IM[1, n], and the cell IM[m, n] and a wiring for supplying a current between the first terminal and the second terminal of the transistor F2 of each of the cell IMref[1] and the cell IMref[m]. The wiring VE functions as a wiring for supplying a constant voltage, for example. The constant voltage can be, for example, a low-level potential, a ground potential, or the like.

In the cell IM[1, 1], a second terminal of the transistor F1 is electrically connected to a wiring WCL[1], and a gate of the transistor F1 is electrically connected to a wiring WSL[1]. The second terminal of the transistor F2 is electrically connected to the wiring WCL[1], and a second terminal of the capacitor C5 is electrically connected to the wiring XCL[1]. In FIG. 11, in the cell IM[1, 1], a connection portion of the first terminal of the transistor F1, the gate of the transistor F2, and the first terminal of the capacitor C5 is a node NN[1, 1].

In the cell IM[m, 1], the second terminal of the transistor F1 is electrically connected to the wiring WCL[1], and the gate of the transistor F1 is electrically connected to a wiring WSL[m]. The second terminal of the transistor F2 is electrically connected to the wiring WCL[1], and the second terminal of the capacitor C5 is electrically connected to the wiring XCL[m]. In FIG. 11, in the cell IM[m, 1], a connection portion of the first terminal of the transistor F1, the gate of the transistor F2, and the first terminal of the capacitor C5 is a node NN[m, 1].

In the cell IM[1, n], the second terminal of the transistor F1 is electrically connected to a wiring WCL[n], and the gate of the transistor F1 is electrically connected to the wiring WSL[1]. The second terminal of the transistor F2 is electrically connected to the wiring WCL[n], and the second terminal of the capacitor C5 is electrically connected to the wiring XCL[1]. In FIG. 11, in the cell IM[1, n], a connection portion of the first terminal of the transistor F1, the gate of the transistor F2, and the first terminal of the capacitor C5 is a node NN[1, n].

In the cell IM[m, n], the second terminal of the transistor F1 is electrically connected to the wiring WCL[n], and the gate of the transistor F1 is electrically connected to the wiring WSL[m]. The second terminal of the transistor F2 is electrically connected to the wiring WCL[n], and the second terminal of the capacitor C5 is electrically connected to the wiring XCL[m]. In FIG. 11, in the cell IM[m, n], a connection portion of the first terminal of the transistor F1, the gate of the transistor F2, and the first terminal of the capacitor C5 is a node NN[m, n].

In the cell IMref[1], a second terminal of the transistor F1m is electrically connected to the wiring XCL[1], and a gate of the transistor F1m is electrically connected to the wiring WSL[1]. A second terminal of the transistor F2m is electrically connected to the wiring XCL[1], and the second terminal of the capacitor C5 is electrically connected to the wiring XCL[1]. In FIG. 11, in the cell IMref[1], a connection portion of the first terminal of the transistor F1m, the gate of the transistor F2m, and the first terminal of the capacitor C5 is a node NNref[1].

In the cell IMref[m], the second terminal of the transistor F1m is electrically connected to the wiring XCL[m], and the gate of the transistor F1m is electrically connected to the wiring WSL[m]. The second terminal of the transistor F2m is electrically connected to the wiring XCL[m], and the second terminal of the capacitor C5 is electrically connected to the wiring XCL[m]. In FIG. 11, in the cell IMref[m], a connection portion of the first terminal of the transistor F1m, the gate of the transistor F2m, and the first terminal of the capacitor C5 is a node NNref[m].

The node NN[1, 1], the node NN[m, 1], the node NN[1, n], the node NN[m, n], the node NNref[1], and the node NMref[m] described above function as retention nodes of the respective cells.

In the case where the transistor F1 is in an on state in the cells IM[1, 1] to IM[m, n], for example, the transistor F2 is a diode-connected transistor. When a constant voltage supplied by the wiring VE is a ground potential (GND), the transistor F1 is turned on, and a current with a current amount I flows from the wiring WCL to the second terminal of the transistor F2, the potential of the gate of the transistor F2 (node NN) is determined by the current amount I. Since the transistor F1 is in an on state, the potential of the second terminal of the transistor F2 is ideally equal to that of the gate of the transistor F2 (node NN). By turning off the transistor F1, the potential of the gate of the transistor F2 (node NN) is stored. Accordingly, the transistor F2 can make a current with the current amount I, which is a current corresponding to the ground potential of the first terminal of the transistor F2 and the potential of the gate of the transistor F2 (node NN), flow between a source and a drain of the transistor F2. In this specification and the like, such an operation is expressed as "the transistor F2 is programmed such that the amount of current flowing between the source and the drain of the transistor F2 is I".

For example, the circuit SWS1 includes the transistors F3[1] to F3[n]. A first terminal of the transistor F3[1] is electrically connected to the wiring WCL[1], a second terminal of the transistor F3[1] is electrically connected to the circuit WCS, and a gate of the transistor F3[1] is electrically connected to a wiring SWL1. A first terminal of the transistor F3[n] is electrically connected to the wiring WCL[n], a second terminal of the transistor F3[n] is electrically connected to the circuit WCS, and a gate of the transistor F3[n] is electrically connected to a wiring SWL1.

Each of the transistors F3[1] to F3[n] is preferably, for example, an OS transistor which can be used as the transistor F1 and/or the transistor F2.

The circuit SWS1 functions as a circuit that establishes or breaks electrical continuity between the circuit WCS and each of the wirings WCL[1] to WCL[n].

For example, the circuit SWS2 includes the transistors F4[1] to F4[n]. A first terminal of the transistor F4[1] is electrically connected to the wiring WCL[1], a second terminal of the transistor F4[1] is electrically connected to an input terminal of a converter circuit ITRZ[1], and a gate of the transistor F4[1] is electrically connected to a wiring SWL2. A first terminal of the transistor F4[n] is electrically connected to the wiring WCL[n], a second terminal of the transistor F4[n] is electrically connected to an input terminal of the converter circuit ITRZ[n], and a gate of the transistor F4[n] is electrically connected to the wiring SWL2.

Each of the transistors F4[1] to F4[n] is preferably, for example, an OS transistor which can be used as the transistor F1 and/or the transistor F2.

The circuit SWS2 functions as a circuit that establishes or breaks electrical continuity between the wiring WCL[1] and the converter circuit ITRZ[1] and between the wiring WCL[n] and the converter circuit ITRZ[n].

The circuit WCS has a function of transmitting data that is to be stored in each cell of the cell array CA.

The circuit XCS is electrically connected to the wirings XCL[1] to XCL[m]. The circuit XCS has a function of supplying a current corresponding to reference data or a current corresponding to the second data to each of the cells IMref[1] to IMref[m] included in the cell array CA.

The circuit WSD is electrically connected to the wirings WSL[1] to WSL[m]. The circuit WSD has a function of selecting a row of the cell array CA to which the first data is written by supplying a predetermined signal to each of the wirings WSL[1] to WSL[m], when the first data is written to the cells IM[1, 1] to IM[m, n].

For example, the circuit WSD is electrically connected to the wiring SWL1 and the wiring SWL2. The circuit WSD has a function of establishing or breaking electrical continuity between the circuit WCS and the cell array CA by supplying a predetermined signal to the wiring SWL1 and a function of establishing or breaking electrical continuity between the cell array CA and each of the converter circuits ITRZ[1] to ITRZ[n] by supplying a predetermined signal to the wiring SWL2.

The converter circuits ITRZ[1] to ITRZ[n] each include an input terminal and an output terminal, for example. For example, an output terminal of the converter circuit ITRZ[1] is electrically connected to the wiring OL[1], and an output terminal of the converter circuit ITRZ[n] is electrically connected to the wiring OL[n].

The converter circuits ITRZ[1] to ITRZ[n] each have a function of converting a current input to the input terminal into a voltage and outputting the voltage from the output terminal. Examples of the voltage include an analog voltage and a digital voltage. The converter circuits ITRZ[1] to ITRZ[n] may each include an arithmetic circuit of a function system. In that case, for example, the arithmetic circuit may perform an arithmetic operation of a function using the voltage obtained by the conversion and output the results to the wirings OL[1] to OL[n].

Particularly in the case of performing an arithmetic operation of the hierarchical neural network, a sigmoid function, a tan h function, a softmax function, a ReLU function, a threshold function, or the like can be used as the above-described function.

As the circuit WCS illustrated in FIG. 11, an IDAC can be used. As the XCS illustrated in FIG. 11, an IDAC can be used.

<Three-Dimensional Structure of Sensor and Arithmetic Circuit>

Next, a three-dimensional structure of the case where the arithmetic circuit 40 that can perform an arithmetic operation using an output of a sensor provided in part of the display device 10 is provided in the display device 10 will be described. The display device 10_SDV illustrated in FIG. 12 includes a layer PDL, a layer ERL, a layer CCL, and a layer PHL. The components of the arithmetic circuit 40_2 are provided in the layer CCL and the layer PHL.

Figure 12:
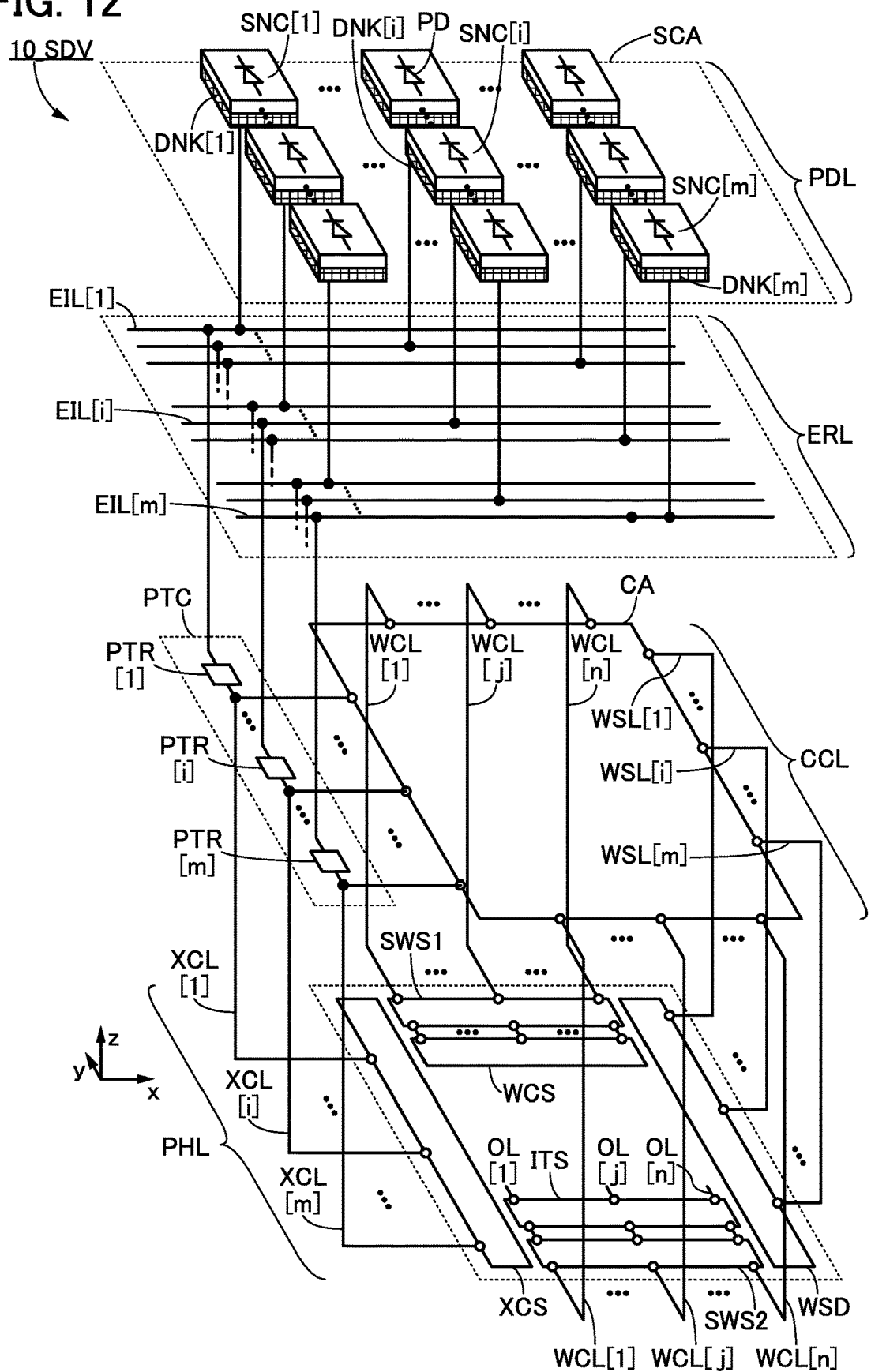
FIG. 12 illustrates a configuration example of a display device.

The display device 10_SDV illustrated in FIG. 12 has a three-dimensional structure; thus, the x direction, the y direction, and the z direction are shown by arrows in FIG. 12. Here, the x direction, the y direction, and the z direction are shown as directions orthogonal to each other. In this specification and the like, one of the x direction, the y direction, and the z direction may be referred to as the first direction. Another of the directions may be referred to as the second direction. The other direction may be referred to as the third direction.

The layer CCL is positioned above the layer PHL, the layer ERL is positioned above the layer CCL, and the layer PDL is positioned above the layer ERL. In other words, the layer PHL, the layer CCL, the layer ERL, and the layer PDL are sequentially stacked in the z direction.

The layer PDL includes a sensor array SCA, for example. The sensor array SCA includes a plurality of electrodes and a plurality of sensors; FIG. 12 illustrates electrodes DNK[1] to DNK[m] (here, m is an integer of 1 or more) and sensors SNC[1] to SNC[m]. In the layer PDL, m electrodes DNK are arranged in a matrix, and the sensors SNC[1] to SNC[m] are provided over the electrodes DNK[1] to DNK[m], respectively.

In the layer PDL illustrated in FIG. 12, the reference numerals of the electrodes DNK[1], DNK[i] (here, i is an integer greater than or equal to 1 and less than or equal to m), and DNK[m] among the electrodes DNK[1] to DNK[m] are selectively illustrated. In the layer PDL illustrated in FIG. 12, the reference numerals of the sensors SNC[1], SNC[i], and SNC[m] among the sensors SNC[1] to SNC[m] are selectively illustrated.

The sensors SNC[1] to SNC[m] have functions of converting sensed data to a current amount and outputting the current amount. The electrodes DNK[1] to DNK[m] each function as a terminal for outputting the amount of current in the sensors SNC[1] to SNC[m]. As the sensors SNC, light-receiving devices can be used, for example. When light-receiving devices are used as the sensors SNC[1] to SNC[m], the layer PDL can be part of an image sensor. In that case, it is preferable that the range of the intensity of light that can be sensed by the light-receiving devices include the intensity of light emitted in an environment where the light-receiving devices are used. FIG. 12 illustrates the display device 10_SDV in which the sensors SNC each including a photodiode PD are used as light-receiving devices. As the photodiode PD, an organic light-emitting diode that can be provided in the same layer as a light-emitting device is preferably used.

Regarding the circuit configuration of the sensor SNC[i], one of an input terminal and an output terminal of the photodiode PD included in the sensor SNC[i] may be electrically connected to the wiring EIL[i] through the electrode DNK[i]. In the circuit configuration of the sensor SNC[i], a switch or the like for shutting off the supply of power to temporarily halt the sensor SNC[i] may be provided, for example. A light-emitting device (not illustrated) for performing display can be provided in the same layer as the sensor SNC[i].

The layer ERL includes the wirings EIL[1] to EIL[m]. In the layer ERL illustrated in FIG. 12, the reference numerals of the wirings EIL[1], EIL[i], and EIL[m] among the wirings EIL[1] to EIL[m] are selectively illustrated.

The wiring EIL[1] is electrically connected to the electrode DNK[1] in the layer PDL. The wiring EIL[i] is electrically connected to the electrode DNK[i] in the layer PDL. The wiring EIL[m] is electrically connected to the electrode DNK[m] in the layer PDL.

Specifically, for example, plugs (referred to as contact holes or the like in some cases) or the like are provided at portions where the electrodes DNK[1] to DNK[m] intersect with the wirings EIL[1] to EIL[m], respectively, in a top view of the display device 10_SDV (when seen in the direction opposite to the arrow of the z axis shown in FIG. 12), and the electrodes DNK[1] to DNK[m] are electrically connected to the wirings EIL[1] to EIL[m], respectively.

Thus, when data is sensed in the sensors SNC[1] to SNC[m], the wirings EIL[1] to EIL[m] function as paths through which currents flow in accordance with the data that has been output from the sensors SNC[1] to SNC[m].

The layer PDL preferably has a configuration in which the sensors SNC[1] to SNC[m] sequentially perform sensing, and sequentially make currents flow to the wirings EIL[1] to EIL[m]. In this case, for example, signal lines for selecting the sensors SNC[1] to SNC[m] are provided in the layer PDL so that signals or the like are sequentially sent to the signal lines and the sensors SNC[1] to SNC[m] sequentially operate.

In the case where the sensors SNC[1] to SNC[m] are each a light-receiving device formed using a photodiode or the like, the layer PDL in the display device 10_SDV can have a configuration where an output terminal (cathode) of the photodiode is electrically connected to the electrode DNK, for example. For another configuration example of the layer PDL in the display device 10_SDV, an input terminal (anode) of the photodiode may be electrically connected to the electrode DNK.

When the sensors SNC[1] to SNC[m] are each a light-receiving device formed using a photodiode or the like, a filter that allows light to enter only one of the sensors SNC[1] to SNC[m] is prepared so that the sensors SNC[1] to SNC[m] can be sequentially operated. Since the number of sensors SNC is m, the number of kinds of filters that allows light to enter only one of the sensors SNC is m. In addition, in the case where a filter that does not allow light to enter any of the sensors SNC[1] to SNC[m] is prepared, the number of kinds of filters is m+1. When the layer PDL is irradiated with light, the filters are sequentially changed, whereby the sensors SNC[1] to SNC[m] can sequentially perform sensing.

In the case where the sensors SNC[1] to SNC[m] are each a light-receiving device formed using a photodiode or the like, the display device 10_SDV may have a configuration where the sensors SNC[1] to SNC[m] are irradiated with light independently of each other, for example. With a configuration where the sensors SNC[1] to SNC[m] are irradiated with light independently of each other, the sensors SNC[1] to SNC[m] can be sequentially irradiated with light to perform sequential sensing.

The layer CCL includes the cell array CA. The layer PHL includes, for example, the circuit PTC, the circuit XCS, the circuit WCS, the circuit WSD, the circuit ITS, the circuit SWS1, and the circuit SWS2. As illustrated in FIG. 12, the cell array CA can be positioned above the circuit XCS, the circuit WCS, the circuit WSD, the circuit ITS, the circuit SWS1, and the circuit SWS2, which correspond to peripheral circuits of the cell array CA.

The cell array CA includes a plurality of cells. The plurality of cells included in the cell array CA each have a function of holding the first data for a product-sum operation and a function of multiplying the first data and the second data, for example.

The cell array CA is electrically connected to a plurality of wirings. Specifically, for example, the cell array CA is electrically connected to the wirings WCL[1] to WCL[n] (here, n is an integer of 1 or more), the wirings WSL[1] to WSL[m], and the wirings XCL[1] to XCL[m] in FIG. 12. In particular, the wirings WCL[1] to WCL[n] are wirings electrically connecting the circuit SWS1 and the circuit SWS2. That is, the circuit SWS1 is electrically connected to the circuit SWS2 through the cell array CA by the wirings WCL[1] to WCL[n]. In FIG. 12, the wirings WSL[1] to WSL[m], the wirings XCL[1] to XCL[m], and the wirings WCL[1] to WCL[n] extend in the z direction.

One of the plurality of cells of the cell array CA is electrically connected to any one of the wirings WCL[1] to WCL[n], any one of the wirings WSL[1] to WSL[m], and any one of the wirings XCL[1] to XCL[m]. Thus, the plurality of cells included in the cell array CA are arranged in a matrix of at least m rows and n columns.

The circuit WCS has a function of supplying a current corresponding to the first data to the wirings WCL[1] to WCL[n]. Thus, the circuit WCS is electrically connected to the wirings WCL[1] to WCL[n] through the circuit SWS1.

The circuit SWS1 has a function of establishing or breaking electrical continuity between the circuit WCS and each of the wirings WCL[1] to WCL[n].

The circuit WSD is electrically connected to the wirings WSL[1] to WSL[m]. The circuit WSD has a function of selecting a row of the cell array CA to which the first data is written by supplying a predetermined signal to each of the wirings WSL[1] to WSL[m], when the first data is written to the cells included in the cell array CA. The wirings WSL[1] to WSL[m] function as write word lines.

The circuit XCS is electrically connected to the wirings XCL[1] to XCL[m]. The circuit XCS has a function of supplying a current corresponding reference data described later or a current corresponding to the second data to the wirings XCL[1] to XCL[m].

The circuit PTC includes the circuits PTR[1] to PTR[m]. A first terminal of the circuit PTR[1] is electrically connected to the wiring XCL[1], a first terminal of the circuit PTR[i] is electrically connected to the wiring XCL[i], and a first terminal of the circuit PTR[m] is electrically connected to the wiring XCL[m].

A second terminal of the circuit PTR[1] is electrically connected to the wiring EIL[1] in the layer ERL, a second terminal of the circuit PTR[i] is electrically connected to the wiring EIL[i] in the layer ERL, and a second terminal of the circuit PTR[m] is electrically connected to the wiring EIL[m] in the layer ERL.

Specifically, for example, plugs or the like are provided at portions where the second terminals of the circuits PTR[1] to PTR[m] intersect with the wirings EIL[1] to EIL[m], respectively, in a top view of the display device 10_SDV, and the second terminals of the circuits PTR[1] to PTR[m] are electrically connected to the wirings EIL[1] to EIL[m], respectively.

The circuit PTR[1] has a function of establishing or breaking electrical continuity between the wiring EIL[1] and the wiring XCL[1]. Similarly, the circuit PTR[i] has a function of establishing or breaking electrical continuity between the wiring EIL[i] and the wiring XCL[i], and the circuit PTR[m] has a function of establishing or breaking electrical continuity between the wiring EIL[m] and the wiring XCL[m]. That is, the circuits PTR[1] to PTR[m] each function as a switching element.

The circuit ITS has functions of acquiring the amount of current flowing through the wirings WCL[1] to WCL[n] and outputting the result depending on the amount of current to the wirings OL[1] to OL[n]. Thus, the circuit ITS is electrically connected to the wirings WCL[1] to WCL[n] through the circuit SWS2. The circuit ITS is electrically connected to the wirings OL[1] to OL[n].

The circuit SWS2 has a function of establishing or breaking electrical continuity between the circuit ITS and each of the wirings WCL[1] to WCL[n].

In the layer ERL in FIG. 12, the wirings EIL[1] to EIL[m] preferably extend along the x direction, for example. That is, the direction in which the wirings EIL[1] to EIL[m] extend is preferably substantially parallel to, further preferably, parallel to the wirings XCL[1] to XCL[m] when seen in the y direction, for example. For example, the wirings EIL[1] to EIL[m] are preferably substantially parallel to, further preferably, parallel to the wirings XCL[1] to XCL[m] included in the layer CCL when seen from above.

As described above, the use of the display device 10_SDV illustrated in FIG. 12 allows substantially free determination of the placement position of the sensor array SCA on the display device including the arithmetic circuit (layer CCL). Therefore, the sensor array SCA can be placed in the center of or the vicinity of the center of the display device when seen from above, for example. The layout of the arithmetic circuit included in the layer CCL does not depend on the installation position of the sensor array SCA; thus, flexibility in the layout of the arithmetic circuit and the peripheral wirings and the like can be increased.

At least part of this embodiment can be implemented in combination with any of the other embodiments described in this specification, as appropriate.

Embodiment 3

In this embodiment, a three-dimensional structure of a driver circuit, a pixel circuit, and a light-emitting device, a configuration example of the pixel circuit, a schematic top view and a schematic cross-sectional view of the light-emitting device, structure examples of a light-emitting device, structure examples of a light-emitting device and a light-receiving device, and a cross-sectional structure example of a display device will be described.

<Three-Dimensional Structure of Driver Circuit, Pixel Circuit, and Light-Emitting Device>

Figure 13A:
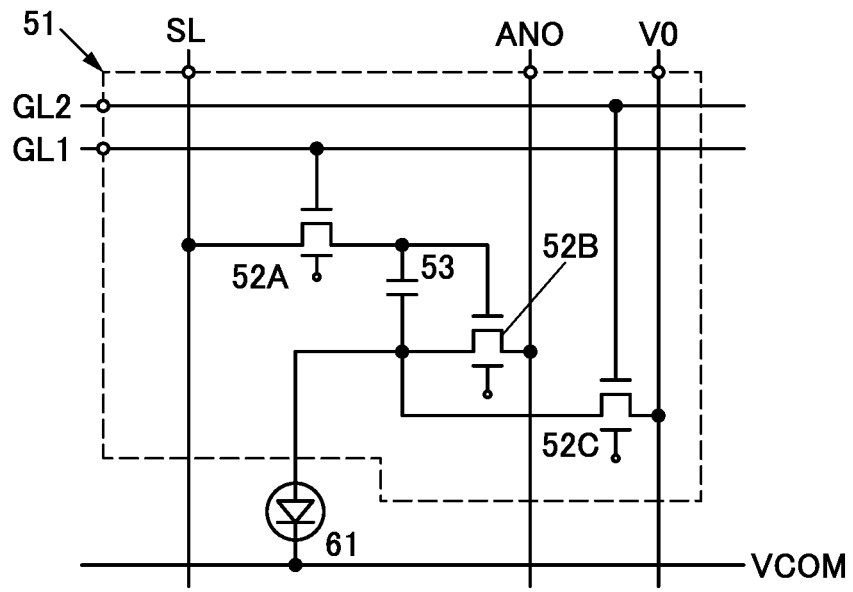
FIGS. 13A and 13B illustrate a configuration example of a display device.
Figure 13B:
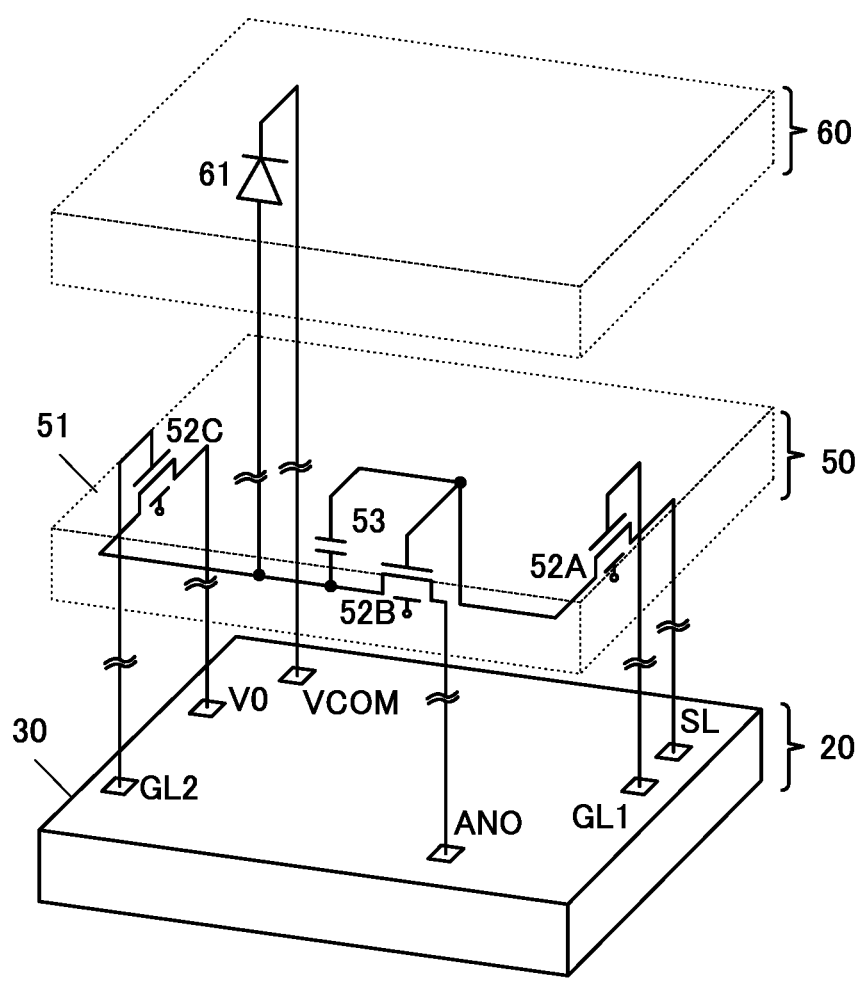

FIGS. 13A and 13B illustrate a configuration examples of the pixel circuit 51 and the light-emitting device 61 connected to the pixel circuit 51. FIG. 13A schematically illustrates the connection relation of the devices, and FIG. 13B schematically illustrates the vertical position relation of the layer 20 including the driver circuit 30, the layer 50 including a plurality of transistors of the pixel circuit 51, and the layer 60 including the light-emitting device 61.

The pixel circuit 51 illustrated as an example in FIGS. 13A and 13B includes a transistor 52A, a transistor 52B, a transistor 52C, and a capacitor 53. The transistor 52A, the transistor 52B, and the transistor 52C can be OS transistors. Each of the OS transistors of the transistor 52A, the transistor 52B, and the transistor 52C preferably includes a back gate electrode, in which case the back gate electrode and a gate electrode can be supplied with the same signals or different signals.

The transistor 52B includes the gate electrode electrically connected to the transistor 52A, a first electrode electrically connected to the light-emitting device 61, and a second electrode electrically connected to a wiring ANO. The wiring ANO supplies a potential for supplying a current to the light-emitting device 61.

The transistor 52A includes a first electrode electrically connected to the gate electrode of the transistor 52B, a second electrode electrically connected to the wiring SL functioning as a source line, and the gate electrode having a function of controlling an on/off state based on the potential of the wiring GL1 functioning as a gate line.

The transistor 52C includes a first electrode electrically connected to the wiring V0, a second electrode electrically connected to the light-emitting device 61, and the gate electrode having a function of controlling an on/off state based on the potential of the wiring GL2 serving as a gate line. The wiring V0 supplies a reference potential and outputs a current flowing in the pixel circuit 51 to the driver circuit 30 or the arithmetic circuit 40.

The capacitor 53 includes a conductive film electrically connected to the gate electrode of the transistor 52B and a conductive film electrically connected to the second electrode of the transistor 52C.

The light-emitting device 61 includes a first electrode electrically connected to the first electrode of the transistor 52B and a second electrode electrically connected to a wiring VCOM. The wiring VCOM supplies a potential for supplying a current to the light-emitting device 61.

Accordingly, the intensity of light emitted by the light-emitting device 61 can be controlled in accordance with an image signal supplied to the gate electrode of the transistor 52B. Furthermore, variations in the gate-source voltage of the transistor 52B can be inhibited by the reference potential of the wiring V0 supplied through the transistor 52C.

A current value that can be used for setting of pixel parameters can be output from the wiring V0. Specifically, the wiring V0 can function as a monitor line for outputting a current flowing through the transistor 52B or a current flowing through the light-emitting device 61 to the outside. A current output to the wiring V0 is converted into a voltage by a source follower circuit or the like and output to the outside. Alternatively, a current output to the wiring V0 can be converted into a digital signal by an A-D converter or the like and output to the arithmetic circuit 40 or the like.

A light-emitting device described in one embodiment of the present invention refers to a self-luminous light-emitting device such as an organic EL device (also referred to as an organic light-emitting diode (OLED)). The light-emitting device electrically connected to the pixel circuit can be a self-luminous light-emitting device such as a light-emitting diode (LED), a micro LED, a quantum-dot light-emitting diode (QLED), or a semiconductor laser.

In the configuration illustrated as an example in FIG. 13B, the wirings electrically connecting the pixel circuit 51 and the driver circuit 30 can be made short, so that the wiring resistance of the wirings can be reduced. Thus, data writing can be performed at high speed, leading to high-speed operation of the display device 10. Therefore, even when the number of pixel circuits 51 included in the display device 10 is large, a sufficiently long frame period can be ensured and thus the pixel density of the display device 10 can be increased. In addition, the increased pixel density of the display device 10 can increase the resolution of an image displayed by the display device 10. For example, the pixel density of the display device 10 can be 1000 ppi or higher, 5000 ppi or higher, or 7000 ppi or higher. Thus, the display device 10 can be, for example, a display device for VR or AR and can be suitably used in an electronic device with a short distance between the display portion and the user, such as an HMID.

The arithmetic circuit 40, the cell array CA, and the photodiodes PD serving as light-receiving devices, which are described in Embodiment 2, can be provided in the layer 20, the layer 50, and the layer 60 illustrated in FIGS. 13A and 13B. Thus, the display device 10 can be provided with an arithmetic circuit and a driver circuit, pixel circuits and a cell array, and light-emitting devices and light-receiving devices.

Although FIGS. 13A and 13B illustrate, as an example, the pixel circuit 51 including three transistors in total, one embodiment of the present invention is not limited thereto. Configuration examples which can be used for the pixel circuit 51 will be described below.

Figure 14A:
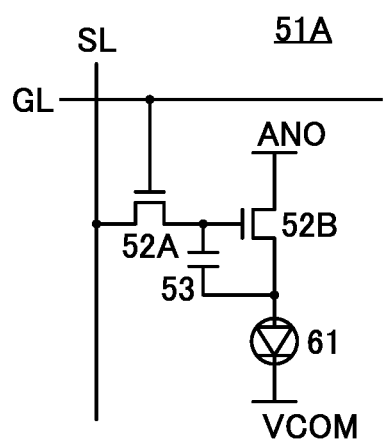
FIGS. 14A to 14D each illustrate a configuration example of a display device.

A pixel circuit 51A illustrated in FIG. 14A includes the transistor 52A, the transistor 52B, and the capacitor 53. FIG. 14A illustrates the light-emitting device 61 connected to the pixel circuit 51A. The wirings SL, GL, ANO, and VCOM are electrically connected to the pixel circuit 51A.

A gate of the transistor 52A is electrically connected to the wiring GL, one of a source and a drain of the transistor 52A is electrically connected to the wiring SL, and the other of the source and the drain of the transistor 52A is electrically connected to the gate of the transistor 52B and one electrode of the capacitor C1. One of a source and a drain of the transistor 52B is electrically connected to the wiring ANO and the other of the source and the drain of the transistor 52B is electrically connected to an anode of the light-emitting device 61. The other electrode of the capacitor C1 is electrically connected to the anode of the light-emitting device 61. A cathode of the light-emitting device 61 is electrically connected to the wiring VCOM.

Figure 14B:
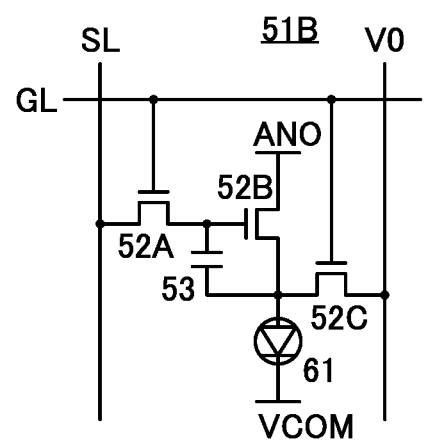

The pixel circuit 51B illustrated in FIG. 14B has a configuration in which the transistor 52C is added to the pixel circuit 51A. In addition, a wiring V0 is electrically connected to the pixel circuit 51B.

Figure 14C:
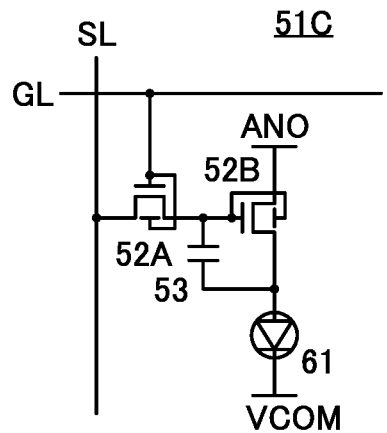
Figure 14D:
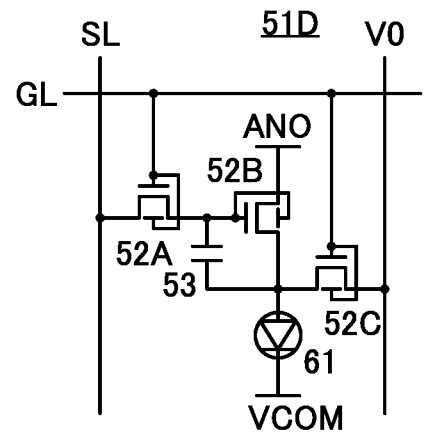

The pixel circuit 51C illustrated in FIG. 14C is an example in which a transistor including a pair of gates is used as each of the transistor 52A and the transistor 52B of the pixel circuit 51A. A pixel circuit 51D illustrated in FIG. 14D is an example in the case where such transistors are used in the pixel circuit 51B. With these structures, a current that can flow through the transistors can be increased. Although a transistor including a pair of gates is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 15A:
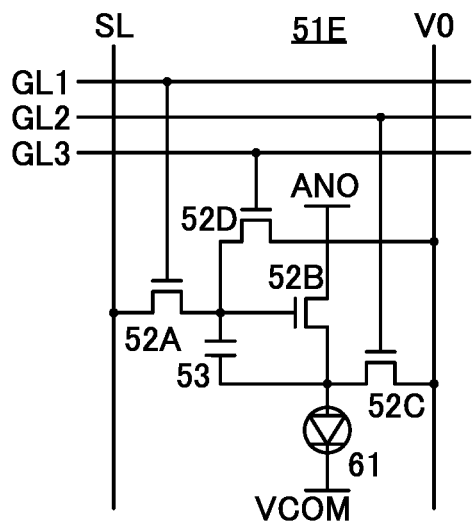
FIGS. 15A to 15D each illustrate a configuration example of a display device.

A pixel circuit 51E illustrated in FIG. 15A has a configuration in which a transistor 52D is added to the pixel circuit 51B. Three wirings (wirings GL1, GL2, and GL3) functioning as gate lines are electrically connected to the pixel circuit 51E.

A gate of the transistor 52D is electrically connected to the wiring GL3, one of a source and a drain of the transistor 52D is electrically connected to the gate of the transistor 52B, and the other of the source and the drain of the transistor 52D is electrically connected to the wiring V0. The gate of the transistor 52A is electrically connected to the wiring GL1, and the gate of the transistor 52C is electrically connected to the wiring GL2.

When the transistors 52C and 52D are turned on at the same time, the source and the gate of the transistor 52B have the same potential, so that the transistor 52B can be turned off. Thus, a current flowing to the light-emitting device 61 can be blocked forcibly. Such a pixel circuit is suitable for the case of using a display method in which a display period and an off period are alternately provided.

Figure 15B:
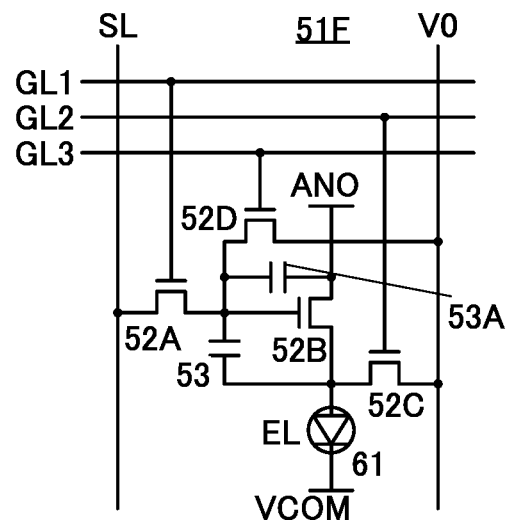

The pixel circuit 51F illustrated in FIG. 15B is an example in which a capacitor 53A is added to the pixel circuit 51E. The capacitor 53A functions as a storage capacitor.

Figure 15C:
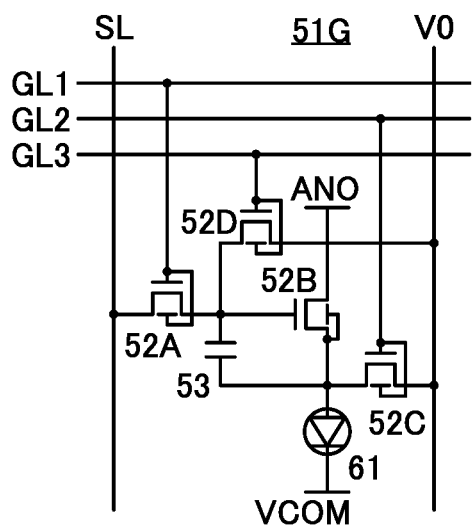
Figure 15D:
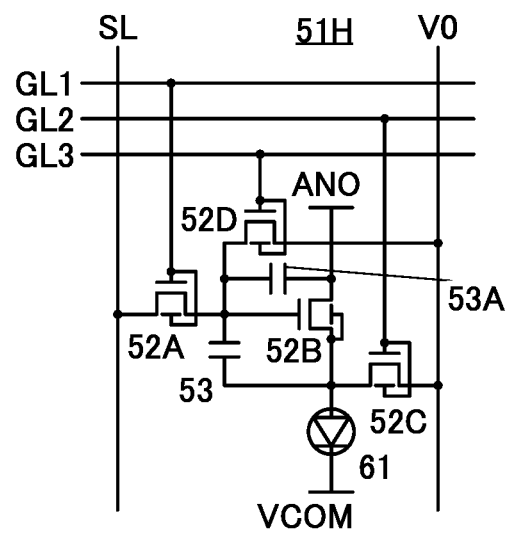

A pixel circuit 51G illustrated in FIG. 15C and a pixel circuit 51H illustrated in FIG. 15D are each an example of the case where a transistor including a pair of gates is used in the pixel circuit 51E or the pixel circuit 51F. A transistor in which a pair of gates are electrically connected to each other is used as each of the transistors 52A, 52C, and 52D, and a transistor in which one of gates is electrically connected to a source is used as the transistor 52B.

<Schematic Top Views and Schematic Cross-Sectional Views of Light-Emitting Device>

Figure 16A:
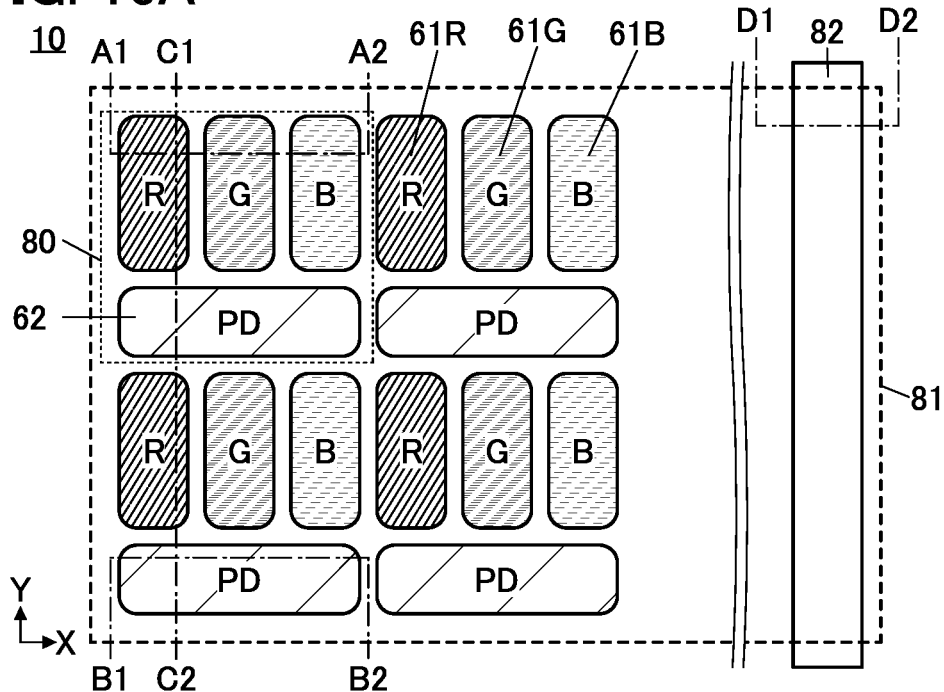
FIGS. 16A and 16B each illustrate a structure example of a display device.

FIG. 16A is a schematic top view illustrating a structure example of the case where light-emitting devices and a light-receiving device are provided in one pixel in the display device 10 of one embodiment of the present invention. The display device 10 includes the light-emitting devices 61R that emit red light, the light-emitting devices 61G that emit green light, the light-emitting devices 61B that emit blue light, and the light-receiving devices 62. In FIG. 16A, light-emitting regions of the light-emitting devices 61 are denoted by R, G, and B to easily differentiate the light-emitting devices 61. In addition, light-receiving regions of the light-emitting devices 62 are denoted by PD.

The light-emitting devices 61R, the light-emitting devices 61G, the light-emitting devices 61B, and the light-receiving devices 62 are arranged in a matrix. FIG. 16A illustrates an example where the light-emitting devices 61R, the light-emitting devices 61G, and the light-emitting devices 61B are arranged in the X direction and the light-receiving devices 62 are arranged thereunder. FIG. 16A illustrates a configuration example where the light-emitting devices 61 that emit light of the same color are arranged in the Y direction intersecting the X direction. In the display device 10 in FIG. 16A, a pixel 80 can be composed of a sub-pixel including the light-emitting device 61R, a sub-pixel including the light-emitting device 61G, and a sub-pixel including the light-emitting device 61B, which are arranged in the X direction, and a sub-pixel including the light-receiving device 62 provided under the sub-pixels, for example.

As each of the light-emitting devices 61R, 61G, and 61B, an EL device such as an organic light-emitting diode (OLED) or a quantum-dot light-emitting diode (QLED) is preferably used. Examples of a light-emitting substance included in the EL devices include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material).

As the light-receiving devices 62, a PN photodiode or a PIN photodiode can be used, for example. The light-receiving devices 62 each function as a photoelectric conversion device that senses light incident on the corresponding light-receiving device 62 and generates electric charge. The amount of generated electric charge depends on the amount of incident light.

It is particularly preferable to use an organic photodiode including a layer containing an organic compound as the light-receiving devices 62. An organic photodiode, which is easily made thin, lightweight, and large in area and has a high degree of freedom for shape and design, can be used in a variety of display devices.

In one embodiment of the present invention, organic EL devices are used as the light-emitting devices 61, and organic photodiodes are used as the light-receiving devices 62. The organic EL devices and the organic photodiodes can be formed over one substrate. Thus, the organic photodiodes can be incorporated in a display device including the organic EL devices. A photolithography method is preferably employed to separate the organic EL devices and the organic photodiodes from each other. This can reduce the distance between the light-emitting devices and the organic photodiodes, enabling fabrication of a display device having a higher aperture ratio than that formed using, for example, a shadow mask such as a metal mask.

FIG. 16A illustrates a common electrode 81 and a connection electrode 82. Here, the connection electrode 82 is electrically connected to the common electrode 81. The connection electrode 82 is provided outside a display portion where the light-emitting devices 61 and the light-receiving devices 62 are arranged. In FIG. 16A, the common electrode 81 having a region overlapping with the light-emitting devices 61, the light-receiving devices 62, and the connection electrode 82 is shown by dashed lines.

The connection electrode 82 can be provided along the outer periphery of the display portion. For example, the connection electrode 82 may be provided along one side of the outer periphery of the display portion or two or more sides of the outer periphery of the display portion. That is, the top surface shape of the connection electrode 82 can be a band shape, an L shape, a square bracket shape, a quadrangle, or the like in the case where the top surface shape of the display portion is a rectangle.

Figure 16B:
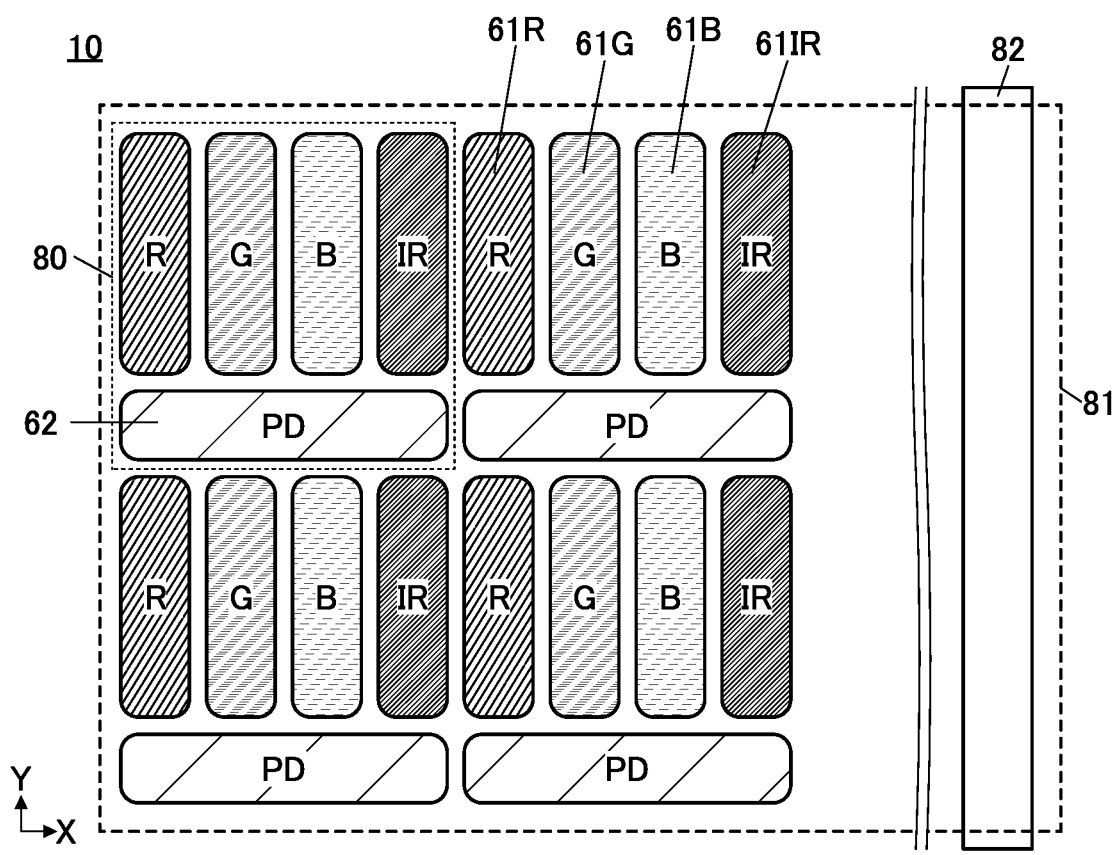

FIG. 16B is a schematic top view illustrating a structure example of the display device 10, which is a modification example of the display device 10 illustrated in FIG. 16A. The display device 10 illustrated in FIG. 16B is different from the display device 10 in FIG. 16A in that light-emitting devices 61IR that emit infrared light are included. The light-emitting devices 61IR can emit near-infrared light (light with a wavelength of 750 nm or more and 1300 nm or less), for example.

In the example illustrated in FIG. 16B, the light-emitting devices 61IR as well as the light-emitting devices 61R, 61G, and 61B are arranged in the X direction, and the light-receiving devices 62 are arranged thereunder. The light-receiving devices 62 each have a function of detecting infrared light.

Figure 17A:
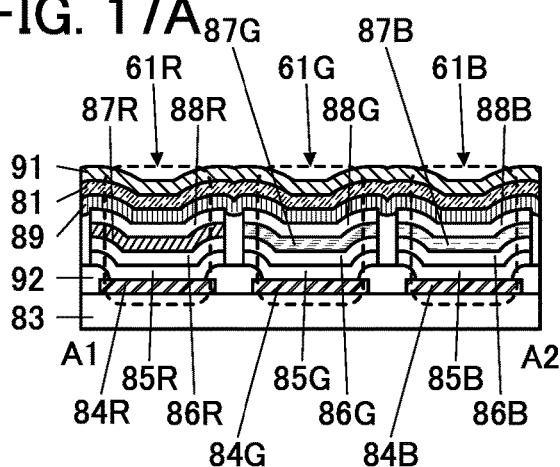
FIGS. 17A to 17D illustrate a structure example of a display device.
Figure 17B:
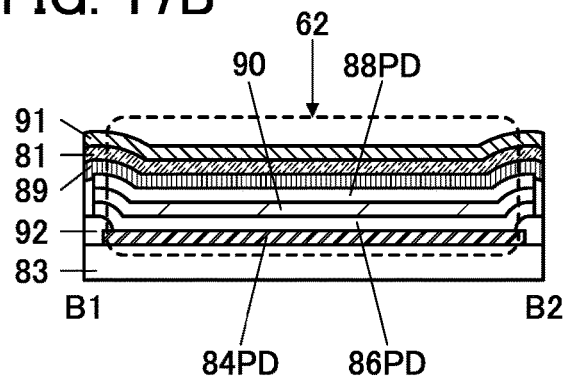
Figure 17C:
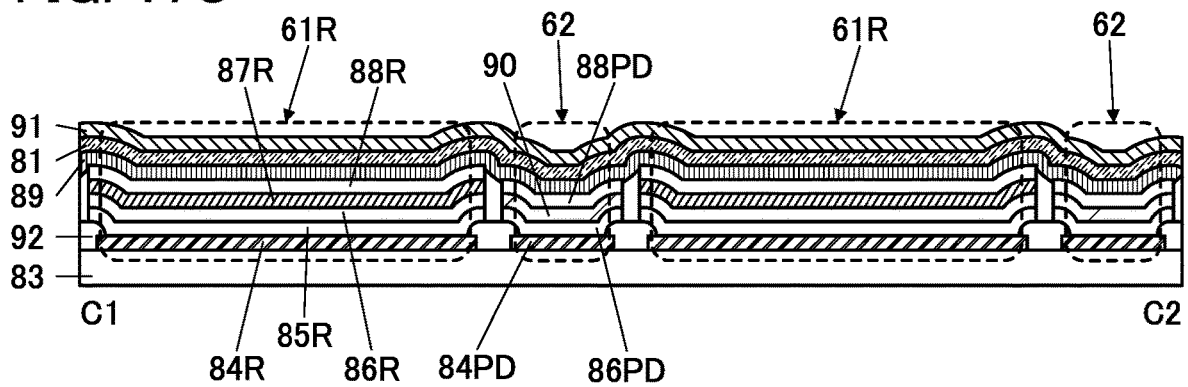
Figure 17D:
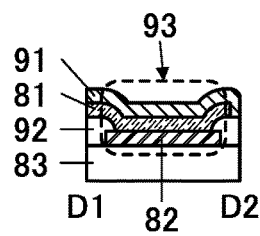

FIG. 17A is a cross-sectional view taken along dashed-dotted line A1-A2 in FIG. 16A, and FIG. 17B is a cross-sectional view taken along dashed-dotted line B1-B2 in FIG. 16A. FIG. 17C is a cross-sectional view taken along dashed-dotted line C1-C2 in FIG. 16A, and FIG. 17D is a cross-sectional view taken along dashed-dotted line D1-D2 in FIG. 16A. The light-emitting devices 61R, the light-emitting devices 61G, the light-emitting devices 61B, and the light-receiving devices 62 are provided over a substrate 83. In the case where the display device 10 includes the light-emitting devices 61IR, the light-emitting devices 61IR are provided over the substrate 83.

In the case where the expression "B over A" or "B under A" is used in this specification and the like, for example, A and B do not always need to include a region where they are in contact with each other.

FIG. 17A illustrates a cross-sectional structure example of the light-emitting devices 61R, 61G, and 61B. FIG. 17B illustrates a cross-sectional structure example of the light-receiving device 62.

The light-emitting device 61R includes a pixel electrode 84R, a hole-injection layer 85R, a hole-transport layer 86R, a light-emitting layer 87R, an electron-transport layer 88R, a common layer 89, and the common electrode 81. The light-emitting device 61G includes a pixel electrode 84G, a hole-injection layer 85G, a hole-transport layer 86G, a light-emitting layer 87G, an electron-transport layer 88G, the common layer 89, and the common electrode 81. The light-emitting device 61B includes a pixel electrode 84B, a hole-injection layer 85B, a hole-transport layer 86B, a light-emitting layer 87B, an electron-transport layer 88B, the common layer 89, and the common electrode 81. The light-receiving device 62 includes a pixel electrode 84PD, a hole-transport layer 86PD, a light-receiving layer 90, an electron-transport layer 88PD, the common layer 89, and the common electrode 81.

The common layer 89 has a function of an electron-injection layer in the light-emitting device 61. Meanwhile, the common layer 89 has a function of an electron-transport layer in the light-receiving device 62. Therefore, the light-receiving device 62 does not necessarily have to include the electron-transport layer 88PD.

The hole-injection layer 85, the hole-transport layer 86, the electron-transport layer 88, and the common layer 89 can also be referred to as functional layers.

The pixel electrode 84, the hole-injection layer 85, the hole-transport layer 86, the light-emitting layer 87, and the electron-transport layer 88 can each be separately provided for each device. The light-emitting devices 61R, 61G, and 61B and the light-receiving devices 62 include the common layer 89 and the common electrode 81 in common.

The light-emitting devices 61 and the light-receiving devices 62 may each include a hole-blocking layer and an electron-blocking layer other than the layers illustrated in FIG. 17A. The light-emitting devices 61 and the light-receiving devices 62 may each include a layer containing a bipolar substance (a substance with a high electron-transport property and a high hole-transport property).

A gap is provided between the common layer 89 and the insulating layer 92 described later. This can inhibit contact between the common layer 89 and each of a side surface of the light-emitting layer 87, a side surface of the light-receiving layer 90, a side surface of the hole-transport layer 86, and a side surface of the hole-injection layer 85. Thus, a short circuit in the light-emitting devices 61 and a short circuit in the light-receiving devices 62 can be inhibited.

The shorter the distance between the light-emitting layers 87 is, the more easily the gap is formed, for example. For example, when the distance is less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be favorably formed.

In FIG. 17A, the light-emitting device 61 includes the pixel electrode 84, the hole-injection layer 85, the hole-transport layer 86, the light-emitting layer 87, the electron-transport layer 88, the common layer 89 (electron-injection layer), and the common electrode 81 in this order from the bottom, and the light-receiving device 62 includes the pixel electrode 84PD, the hole-transport layer 86PD, the light-receiving layer 90, the electron-transport layer 88PD, the common layer 89, and the common electrode 81 in this order from the bottom; however, one embodiment of the present invention is not limited thereto. For example, the light-emitting device 61 may include a pixel electrode, an electron-injection layer, an electron-transport layer, a light-emitting layer, a hole-transport layer, a hole-injection layer, and a common electrode in this order from the bottom, and the light-receiving device 62 may include a pixel electrode, an electron-transport layer, a light-receiving layer, a hole-transport layer, and a common electrode in this order from the bottom. In that case, the hole-injection layer included in the light-emitting device 61 can be a common layer, and the common layer can be provided between the hole-transport layer included in the light-receiving device 62 and the common electrode. In addition, the electron-injection layers can be separated between the light-emitting devices 61.

Although the electron-transport layer is considered as being provided over the hole-transport layer in the description below, the following description can also be applied to the case where the electron-transport layer is provided under the hole-transport layer, when "electron" is replaced with "hole" and "hole" is replaced with "electron", for example.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used.

The hole-transport layer transports holes injected from the anode by the hole-injection layer, to the light-emitting layer. The hole-transport layer contains a hole-transport material. The hole-transport material preferably has a hole mobility of $10^{-6}$ cm$^2$/Vs or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility of $1\times10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide (LiO$_x$), or cesium carbonate.

Alternatively, an electron-transport material may be used for the electron-injection layer. For example, a compound having an unshared electron pair and an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound including an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2′,3′-c]phenazine (abbreviation: HATNA), 2,4,6-tris[3′-(pyridin-3-yl)biphenyl-3-yl]-1,3,5-triazine (abbreviation: TmPPPyTz), or the like can be used for the organic compound including an unshared electron pair. Note that NBPhen has a higher glass transition temperature (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton, an organometallic complex (particularly an iridium complex) having a phenylpyridine derivative including an electron-withdrawing group as a ligand, a platinum complex, and a rare earth metal complex.

The light-emitting layer may contain one or more kinds of organic compounds (e.g., a host material or an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes a combination of a hole-transport material and an electron-transport material that easily forms an exciplex and a phosphorescent material, for example. With such a structure, light emission can be efficiently obtained by exciplex-triplet energy transfer (ExTET), which is energy transfer from an exciplex to a light-emitting substance (phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

A light-emitting layer 87R of the light-emitting device 61R includes a light-emitting organic compound that emits light with a peak at least in a red wavelength range. A light-emitting layer 87G of the light-emitting device 61G includes a light-emitting organic compound that emits light with a peak at least in a green wavelength range. A light-emitting layer 87B of the light-emitting device 61B includes a light-emitting organic compound that emits light with a peak at least in a blue wavelength range. The light-receiving layer 90 included in the light-receiving device 62 contains an organic compound having detection sensitivity in a wavelength range of visible light, for example.

A conductive film that transmits visible light is used for either the pixel electrode 84 or the common electrode 81, and a reflective conductive film is used for the other. When the pixel electrode 84 has a light-transmitting property and the common electrode 81 has a light-reflecting property, the display device 10 can have a bottom emission structure. When the pixel electrode 84 has a light-reflecting property and the common electrode 81 has a light-transmitting property, the display device 10 can have a top emission structure. When both the pixel electrode 84 and the common electrode 81 transmit light, the display device 10 can have a dual-emission structure.

The light-emitting devices 61 each preferably have a micro-optical resonator (microcavity) structure. In that case, light emitted from the light-emitting layer 87 can be resonated between the pixel electrode 84 and the common electrode 81, so that light emitted from the light-emitting device 61 can be intensified.

In the case where the light-emitting devices 61 each have a microcavity structure, one of the common electrode 81 and the pixel electrode 84 is preferably an electrode having both a light-transmitting property and a light-reflecting property (transflective electrode), and the other of the common electrode 81 and the pixel electrode 84 is preferably a reflective electrode. Here, the transflective electrode can have a stacked-layer structure of a reflective electrode and an electrode having a property of transmitting visible light (also referred to as a transparent electrode). The transparent electrode can be referred to as an optical adjustment layer.

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices 61. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where a light-emitting device that emits near-infrared light is used in the display device, the near-infrared light (light with a wavelength greater than or equal to 750 nm and less than or equal to 1300 nm) transmittance and reflectivity of these electrodes are preferably in the above numerical ranges.

The insulating layer 92 is provided so as to cover end portions of the pixel electrode 84R, end portions of the pixel electrode 84G, end portions of the pixel electrode 84B, and end portions of the pixel electrode 84PD. End portions of the insulating layer 92 are preferably tapered. The insulating layer 92 is not necessarily provided.

For example, the hole-injection layer 85R, the hole-injection layer 85G, the hole-injection layer 85B, and the hole-transport layer 86PD each include a region in contact with the top surface of the pixel electrode 84 and a region in contact with a surface of the insulating layer 92. In addition, end portions of the hole-injection layer 85R, end portions of the hole-injection layer 85G, end portions of the hole-injection layer 85B, and end portions of the hole-transport layer 86PD are positioned over the insulating layer 92.

As illustrated in FIG. 17A, a gap is provided between the light-emitting devices 61 that emit light of different colors, for example, between two light-emitting layers 87. In this manner, it is preferable that the light-emitting layers 87R, 87G, and 87B be provided such that they are not in contact with each other, for example. This favorably prevents unintentional light emission from being caused by current flowing through adjacent two light-emitting layers 87. Thus, the contrast of the display device 10 can be increased, so that the display quality of the display device 10 can be improved.

A protective layer 91 is provided over the common electrode 81. The protective layer 91 has a function of preventing diffusion of impurities such as water into each light-emitting device from the above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as an indium gallium oxide or an indium gallium zinc oxide may be used for the protective layer 91.

In this specification and the like, a silicon oxynitride film refers to a film that contains more oxygen than nitrogen. A silicon nitride oxide film refers to a film containing more nitrogen than oxygen.

A stack of an inorganic insulating film and an organic insulating film can be used as the protective layer 91. For example, a structure where an organic insulating film is provided between a pair of inorganic insulating films is preferably employed. Furthermore, an organic insulating film preferably functions as a planarization film. This planarizes the top surface of the organic insulating film, resulting in improved coverage with an inorganic insulating film thereover and an enhanced barrier property. The top surface of the protective layer 91 is flat; thus, in the case where a structure (e.g., a color filter, an electrode of a touch sensor, or a lens array) is provided above the protective layer 91, the influence of an uneven shape due to a structure below the protective layer 91 can be reduced.

FIG. 17C illustrates a cross-sectional structure example of the display device 10 in the Y direction, specifically, a cross-sectional structure example of the light-emitting device 61R and the light-receiving device 62. The light-emitting devices 61G and 61B can be arranged in the Y direction like the light-emitting device 61R.

FIG. 17D illustrates a connection portion 93 where the connection electrode 82 and the common electrode 81 are electrically connected to each other. In the connection portion 93, the common electrode 81 is provided over and in contact with the connection electrode 82, and the protective layer 91 is provided so as to cover the common electrode 81. The insulating layer 92 is provided so as to cover end portions of the connection electrode 82.

Structure Example of Light-Emitting Device

Figure 18A:
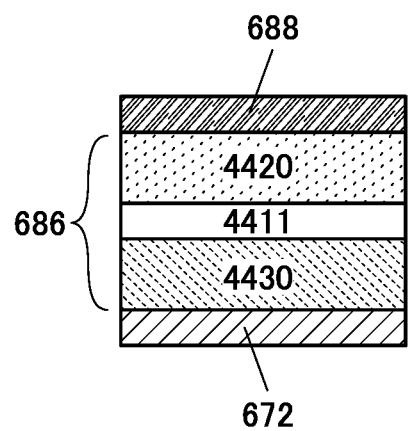
FIGS. 18A to 18D each illustrate a structure example of a display device.

As illustrated in FIG. 18A, a light-emitting device includes an EL layer 686 between a pair of electrodes (an electrode 672 and an electrode 688). The EL layer 686 can be formed of a plurality of layers such as a layer 4420, a light-emitting layer 4411, and a layer 4430. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can function as a single light-emitting unit, and the structure in FIG. 18A is referred to as a single structure in this specification.

Figure 18B:
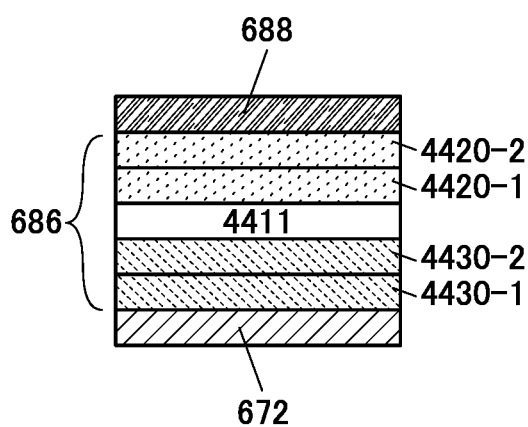

FIG. 18B is a modification example of the EL layer 686 included in the light-emitting device illustrated in FIG. 18A. Specifically, a light-emitting device illustrated in FIG. 18B includes a layer 4430-1 over the electrode 672, a layer 4430-2 over the layer 4430-1, a light-emitting layer 4411 over the layer 4430-2, a layer 4420-1 over the light-emitting layer 4411, a layer 4420-2 over the layer 4420-1, and an electrode 688 over the layer 4420-2. For example, in the case where the electrode 672 is an anode and the electrode 688 is a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the electrode 672 is as a cathode and the electrode 688 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With the layered structure in FIG. 18B, carriers can be efficiently injected into the light-emitting layer 4411, so that the efficiency of carrier recombination in the light-emitting layer 4411 can be increased.

Figure 18C:
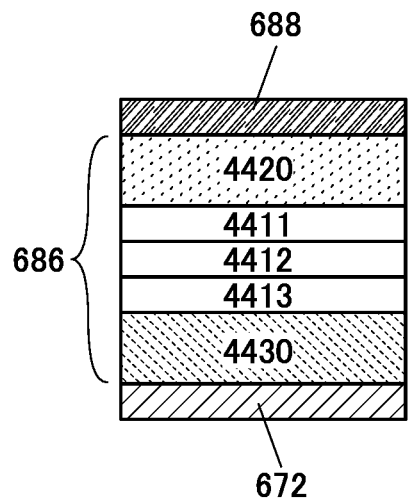

The structure in which a plurality of light-emitting layers (light-emitting layers 4411, 4412, and 4413) is provided between the layer 4420 and the layer 4430 as illustrated in FIG. 18C is another variation of the single structure.

Figure 18D:
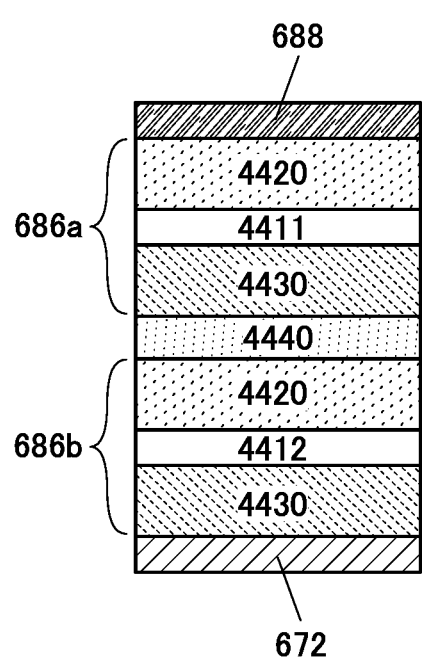

The structure in which a plurality of light-emitting units (El layers 686a and 686b) is connected in series with an intermediate layer (charge-generation layer) 4440 therebetween as illustrated in FIG. 18D is referred to as a tandem structure in this specification. The structure illustrated in FIG. 18D is referred to as a tandem structure in this specification and the like; however, the name of the structure is not limited thereto. A tandem structure may be referred to as a stack structure, for example. The tandem structure enables a light-emitting device capable of high luminance light emission.

In FIGS. 18C and 18D, the layer 4420 and the layer 4430 may each have a stacked-layer structure of two or more layers as in FIG. 18B.

A structure in which light-emitting devices that emit light of different colors (here, blue (B), green (G), and red (R)) are separately formed is referred to as a side-by-side (SBS) structure in some cases.

In the case where the single structure and the tandem structure described above and the SBS structure are compared with each other, the SBS structure, the tandem structure, and the single structure have lower consumption in this order. To reduce power consumption, the SBS structure is preferably employed. Meanwhile, the single structure and the tandem structure are preferable in terms of lower manufacturing cost or higher manufacturing yield because the manufacturing processes for the single structure and the tandem structure are simpler than that for the SBS structure.

The emission colors of the light-emitting devices can be changed to red, green, blue, cyan, magenta, yellow, white, or the like depending on a material of the EL layer 686. When the light-emitting devices have a microcavity structure, the color purity can be further increased.

In a light-emitting device that emits white light, a light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that a light-emitting device can emit white light as a whole. This can be applied to a light-emitting device including three or more light-emitting layers.

A light-emitting layer preferably contains two or more selected from light-emitting substances that emit light of red (R), green (G), blue (B), yellow (Y), orange (O), and the like. Alternatively, a light-emitting layer preferably contains two or more light-emitting substances each of which emits light containing two or more of spectral components of R, G, and B.

Structure Examples of Light-Emitting Device and Light-Receiving Device

The display device of one embodiment of the present invention is a top-emission display device where light is emitted in the direction opposite to a substrate over which light-emitting devices are formed. In this embodiment, a top-emission display device provided with light-emitting devices and a light-receiving device will be described as an example.

In this specification and the like, unless otherwise specified, in describing a structure including a plurality of elements (e.g., light-emitting devices and light-emitting layers), letters are not added when a common part of the elements is described. For example, when a common part of a light-emitting layer 383R, a light-emitting layer 383G, and the like is described, the light-emitting layers are simply referred to as the light-emitting layer 383, in some cases.

Figure 19A:
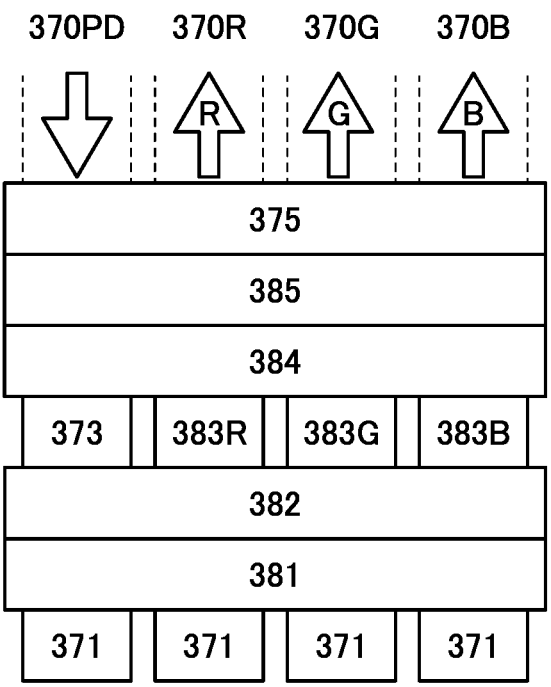
FIGS. 19A and 19B each illustrate a structure example of a display device.

A display device 380A illustrated in FIG. 19A includes a light-receiving device 370PD, a light-emitting device 370R which emits red (R) light, a light-emitting device 370G which emits green (G) light, and a light-emitting device 370B which emits blue (B) light.

Each of the light-emitting devices includes a pixel electrode 371, a hole-injection layer 381, a hole-transport layer 382, a light-emitting layer, an electron-transport layer 384, an electron-injection layer 385, and a common electrode 375 which are stacked in this order. The light-emitting device 370R includes a light-emitting layer 383R, the light-emitting device 370G includes a light-emitting layer 383G, and the light-emitting device 370B includes a light-emitting layer 383B. The light-emitting layer 383R includes a light-emitting substance which emits red light, the light-emitting layer 383G includes a light-emitting substance which emits green light, and the light-emitting layer 383B includes a light-emitting substance which emits blue light.

The light-emitting devices are electroluminescent devices which emit light to the common electrode 375 side on voltage application between the pixel electrode 371 and the common electrode 375.

The light-receiving device 370PD includes the pixel electrode 371, the hole-injection layer 381, the hole-transport layer 382, an active layer 373, the electron-transport layer 384, the electron-injection layer 385, and the common electrode 375 which are stacked in this order.

The light-receiving device 370PD is a photoelectric conversion device that receives light incident from the outside of the display device 380A and converts the light into an electric signal.

This embodiment is described assuming that the pixel electrodes 371 function as anodes and the common electrode 375 functions as a cathode in the light-emitting devices and the light-receiving device. In other words, the light-receiving device is driven by application of reverse bias between the pixel electrode 371 and the common electrode 375, whereby light incident on the light-receiving device can be sensed and electric charge can be generated and extracted as a current.

In the display device of this embodiment, an organic compound is used for the active layer 373 of the light-receiving device 370PD. The light-receiving device 370PD can share the layers other than the active layer 373 with the light-emitting devices. Therefore, the light-receiving device 370PD can be formed concurrently with the formation of the light-emitting devices only by adding a step of forming the active layer 373 in the manufacturing process of the light-emitting devices. The light-emitting devices and the light-receiving device 370PD can be formed over one substrate. Accordingly, the light-receiving device 370PD can be incorporated into the display device without a significant increase in the number of manufacturing steps.

In the display device 380A, for example, the light-receiving device 370PD and the light-emitting devices have a common structure except that the active layer 373 of the light-receiving device 370PD and the light-emitting layer 383 of the light-emitting devices are separately formed. The structures of the light-receiving device 370PD and the light-emitting devices are not limited thereto. The light-receiving device 370PD and the light-emitting devices may have separately formed layers in addition to the active layer 373 and the light-emitting layer 383. The light-receiving device 370PD and the light-emitting devices preferably include at least one layer used in common (common layer). Thus, the light-receiving device 370PD can be incorporated into the display device without a significant increase in the number of manufacturing steps.

A conductive film that transmits visible light is used as the electrode through which light is extracted, which is either the pixel electrode 371 or the common electrode 375. A conductive film that reflects visible light is preferably used as the electrode through which light is not extracted.

The light-emitting devices included in the display device of this embodiment preferably employ a micro-optical resonator (microcavity) structure. Therefore, one of the pair of electrodes of the light-emitting devices is preferably an electrode having properties of transmitting and reflecting visible light (transflective electrode), and the other is preferably an electrode having a property of reflecting visible light (reflective electrode). When the light-emitting devices have a microcavity structure, light obtained from the light-emitting layers can be resonated between the electrodes, whereby light emitted from the light-emitting devices can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where any of the light-emitting devices emits near-infrared light (light with a wavelength greater than or equal to 750 nm and less than or equal to 1300 nm), the near-infrared light transmittance and reflectivity of these electrodes preferably satisfy the above-described numerical ranges of the visible light transmittance and reflectivity.

The light-emitting device includes at least the light-emitting layer 383. In addition to the light-emitting layer 383, the light-emitting device may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

For example, the light-emitting devices and the light-receiving device can share at least one of the hole-injection layer, the hole-transport layer, the electron-transport layer, and the electron-injection layer. At least one of the hole-injection layer, the hole-transport layer, the electron-transport layer, and the electron-injection layer can each be separately formed for the light-emitting devices and the light-receiving device.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used.

In the light-emitting devices, the hole-transport layer transports holes injected from the anode by the hole-injection layer, to the light-emitting layer. In the light-receiving device, the hole-transport layer transports holes generated in the active layer on the basis of incident light, to the anode. The hole-transport layer contains a hole-transport material. The hole-transport material preferably has a hole mobility of $1\times10^{-6}$ cm$^2$/Vs or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene deriva-tive, and a furan derivative) and an aromatic amine (a compound having an aromatic amine skeleton), are preferred.

In the light-emitting devices, the electron-transport layer transports electrons injected from the cathode by the electron-injection layer, to the light-emitting layer. In the light-receiving device, the electron-transport layer transports electrons generated in the active layer on the basis of incident light, to the cathode. The electron-transport layer contains an electron-transport material. The electron-transport material preferably has an electron mobility of $1\times10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 383 contains a light-emitting substance. The light-emitting layer 383 can contain one kind or two or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 383 may contain one kind or two or more kinds of organic compounds (e.g., a host material or an assist material) in addition to the light-emitting substance (guest material). As one kind or two or kinds of organic compounds, one or both of the hole-transport material and the electron-transport material can be used. Alternatively, as one kind or two or kinds of organic compounds, a bipolar material or a TADF material may be used.

The light-emitting layer 383 preferably includes a phosphorescent material and a combination of a hole-transport material and an electron-transport material that easily forms an exciplex. With such a structure, light emission can be efficiently obtained by exciplex-triplet energy transfer (ExTET), which is energy transfer from an exciplex to a light-emitting substance (phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In a combination of materials for forming an exciplex, the highest occupied molecular orbital level (HOMO level) of the hole-transport material is preferably higher than or equal to that of the electron-transport material. The lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectra of each of the hole-transport material and the electron-transport material (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the hole-transport material and the electron-transport material, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

The active layer 373 includes a semiconductor. Examples of the semiconductor include an inorganic semiconductor such as silicon and an organic semiconductor including an organic compound. This embodiment shows an example in which an organic semiconductor is used as the semiconductor included in the active layer 373. The use of an organic semiconductor is preferable because the light-emitting layer 383 and the active layer 373 can be formed by the same method (e.g., a vacuum evaporation method) and thus the same manufacturing apparatus can be used.

Examples of an n-type semiconductor material included in the active layer 373 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1'',4',4''-tetrahydro-di[1,4]methanonaphthaleno[1,2:2',3',56,60:2'',3''][5,6] fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting devices and the light-receiving device, and an inorganic compound may also be included. Each of the layers included in the light-emitting devices and the light-receiving device can be formed by any of the following methods: an evaporation method (including a vacuum evaporation method), a transfer method, a printing method, an inkjet method, a coating method, and the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer 373, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBTB-T or a PBDB-T derivative can be used.

The active layer 373 may contain a mixture of three or more kinds of materials. For example, a third material may be mixed with an n-type semiconductor material and a p-type semiconductor material in order to extend the wavelength range. The third material may be a low molecular compound or a high molecular compound.

Figure 19B:
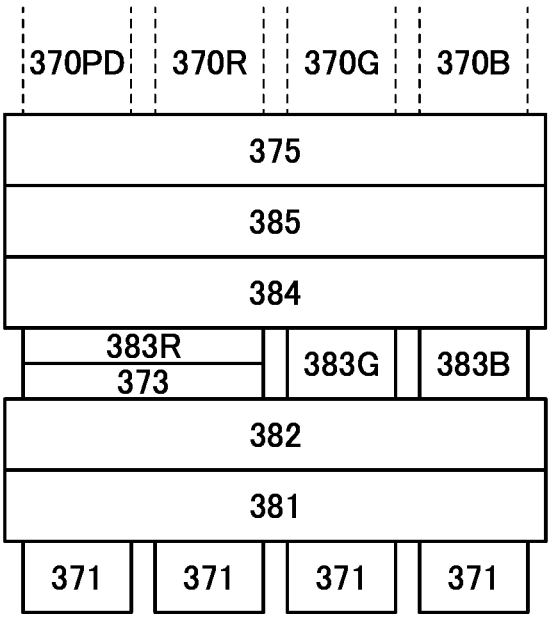

A display device 380B illustrated in FIG. 19B is different from the display device 380A in that the light-receiving device 370PD and the light-emitting device 370R have the same structure.

The light-receiving device 370PD and the light-emitting device 370R share the active layer 373 and the light-emitting layer 383R.

Here, the light-receiving device 370PD preferably has the same structure as the light-emitting device which emits light with a wavelength that is longer than the sensing-target light wavelength. For example, the light-receiving device 370PD with a structure for sensing blue light can have a structure similar to that of either or both of the light-emitting device 370R and the light-emitting device 370G. For example, the light-receiving device 370PD with a structure for sensing green light can have a structure similar to that of the light-emitting device 370R.

When the light-receiving device 370PD and the light-emitting device 370R have a common structure, the number of film formation steps and the number of masks can be reduced from those used in the structure where the light-receiving device 370PD and the light-emitting device 370R include separately formed layers. Consequently, the manufacturing steps and the manufacturing costs of the display device can be reduced.

When the light-receiving device 370PD and the light-emitting device 370R have the common structure, a space provided to allow for misalignment can be reduced compared with the structure in which the light-receiving device 370PD and the light-emitting device 370R include separately formed layers. Accordingly, the aperture ratio of pixels can be increased and the light extraction efficiency of the display device can be increased. This can extend the life of the light-emitting device. Furthermore, the display device can exhibit a high luminance. Moreover, the resolution of the display device can be increased.

The light-emitting layer 383R includes a light-emitting material that emits red light. The active layer 373 contains an organic compound that absorbs light with a wavelength shorter than that of red light (e.g., either or both of green light and blue light). The active layer 373 preferably contains an organic compound that does not easily absorb red light and that absorbs light with a wavelength shorter than that of red light. In this way, red light can be efficiently extracted from the light-emitting device 370R, and the light-receiving device 370PD can sense light with a wavelength shorter than that of red light with high accuracy.

Although the display device 380B is an example where the light-emitting device 370R and the light-receiving device 370PD have the same structure, the optical adjustment layer of the light-emitting device 370R may have a thickness different from that of the optical adjustment layer of the light-receiving device 370PD.

A display device 380C illustrated in FIGS. 20A and 20B includes a light-emitting and light-receiving device 370SR that emits red (R) light and has a light-receiving function, the light-emitting device 370G, and the light-emitting device 370B. The above description of the display device 380A and the like can be referred to for the structures of the light-emitting devices 370G and 370B.

The light-emitting and light-receiving device 370SR includes the pixel electrode 371, the hole-injection layer 381, the hole-transport layer 382, the active layer 373, the light-emitting layer 383R, the electron-transport layer 384, the electron-injection layer 385, and the common electrode 375 which are stacked in this order. The light-emitting and light-receiving device 370SR has the same structure as the light-emitting device 370R and the light-receiving device 370PD illustrated in the display device 380B.

FIG. 20A shows a case where the light-emitting and light-receiving device 370SR functions as a light-emitting device. FIG. 20A illustrates an example in which the light-emitting device 370B emits blue light, the light-emitting device 370G emits green light, and the light-emitting and light-receiving device 370SR emits red light.

FIG. 20B shows a case where the light-emitting and light-receiving device 370SR functions as a light-receiving device. In the example illustrated in FIG. 20B, the light-emitting and light-receiving device 370SR receives blue light emitted by the light-emitting device 370B and green light emitted by the light-emitting device 370G.

The light-emitting device 370B, the light-emitting device 370G, and the light-emitting and light-receiving device 370SR each include the pixel electrode 371 and the common electrode 375. In this embodiment, the case where the pixel electrode 371 functions as an anode and the common electrode 375 functions as a cathode is described as an example. The light-emitting and light-receiving device 370SR is driven by application of reverse bias between the pixel electrode 371 and the common electrode 375, whereby light incident on the light-emitting and light-receiving device 370SR can be sensed and electric charge can be generated and extracted as a current.

It can be said that the light-emitting and light-receiving device 370SR has a structure in which the active layer 373 is added to the light-emitting device. That is, the light-emitting and light-receiving device 370SR can be formed concurrently with the light-emitting device only by adding a step of forming the active layer 373 in the manufacturing process of the light-emitting device. The light-emitting devices and the light-emitting and light-receiving device can be formed over one substrate. Thus, one or both of an image capturing function and a sensing function can be provided to the display portion without a significant increase in the number of manufacturing steps.

The stacking order of the light-emitting layer 383R and the active layer 373 is not limited. In FIGS. 20A and 20B, the active layer 373 is provided over the hole-transport layer 382, and the light-emitting layer 383R is provided over the active layer 373. The stacking order of the light-emitting layer 383R and the active layer 373 may be reversed.

The light-emitting and light-receiving device may exclude at least one of the hole-injection layer 381, the hole-transport layer 382, the electron-transport layer 384, and the electron-injection layer 385. The light-emitting and light-receiving device may include another functional layer such as a hole-blocking layer or an electron-blocking layer.

In the light-emitting and light-receiving device, a conductive film that transmits visible light is used as the electrode through which light is extracted. A conductive film that reflects visible light is preferably used as the electrode through which light is not extracted.

The functions and materials of the layers constituting the light-emitting and light-receiving device are similar to those of the layers constituting the light-emitting devices and the light-receiving device and not described in detail here.

FIGS. 20C to 20G illustrate examples of stacked-layer structures of light-emitting and light-receiving devices.

A light-emitting and light-receiving device illustrated in FIG. 20C includes a first electrode 377, the hole-injection layer 381, the hole-transport layer 382, the light-emitting layer 383R, the active layer 373, the electron-transport layer 384, the electron-injection layer 385, and a second electrode 378.

FIG. 20C illustrates an example in which the light-emitting layer 383R is provided over the hole-transport layer 382, and the active layer 373 is stacked over the light-emitting layer 383R.

As illustrated in FIGS. 20A to 20C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a bipolar substance is preferably used for the buffer layer. Alternatively, as the buffer layer, at least one of a hole-injection layer, a hole-transport layer, an electron-transport layer, an electron-injection layer, a hole-blocking layer, an electron-blocking layer, and the like can be used. FIG. 20D illustrates an example where the hole-transport layer 382 is used as the buffer layer.

The buffer layer provided between the active layer 373 and the light-emitting layer 383R can suppress transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving device including the buffer layer between the active layer 373 and the light-emitting layer 383R.

FIG. 20E illustrates an example in which a hole-transport layer 382-1, the light-emitting layer 383R, a hole-transport layer 382-2, and the active layer 373 are stacked in this order over the hole-injection layer 381. The hole-transport layer 382-2 functions as a buffer layer. The hole-transport layers 382-1 and 382-2 may contain the same material or different materials. Instead of the hole-transport layer 382-2, a layer that can be used as the buffer layer may be used. The positions of the active layer 373 and the light-emitting layer 383R may be interchanged.

The light-emitting and light-receiving device illustrated in FIG. 20F is different from the light-emitting and light-receiving device illustrated in FIG. 20A in that the hole-transport layer 382 is not included. Thus, the light-emitting and light-receiving device may exclude at least one of the hole-injection layer 381, the hole-transport layer 382, the electron-transport layer 384, and the electron-injection layer 385. The light-emitting and light-receiving device may include another functional layer such as a hole-blocking layer or an electron-blocking layer.

The light-emitting and light-receiving device illustrated in FIG. 20G is different from the light-emitting and light-receiving devices illustrated in FIG. 20A in including a layer 389 serving as both a light-emitting layer and an active layer instead of including the active layer 373 and the light-emitting layer 383R.

As the layer serving as both a light-emitting layer and an active layer, a layer containing three materials which are an n-type semiconductor that can be used for the active layer 373, a p-type semiconductor that can be used for the active layer 373, and a light-emitting substance that can be used for the light-emitting layer 383R can be used, for example.

An absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

At least part of this embodiment can be implemented in combination with any of the other embodiments described in this specification, as appropriate.

Structure Example of Cross-Sectional View

Figure 21:
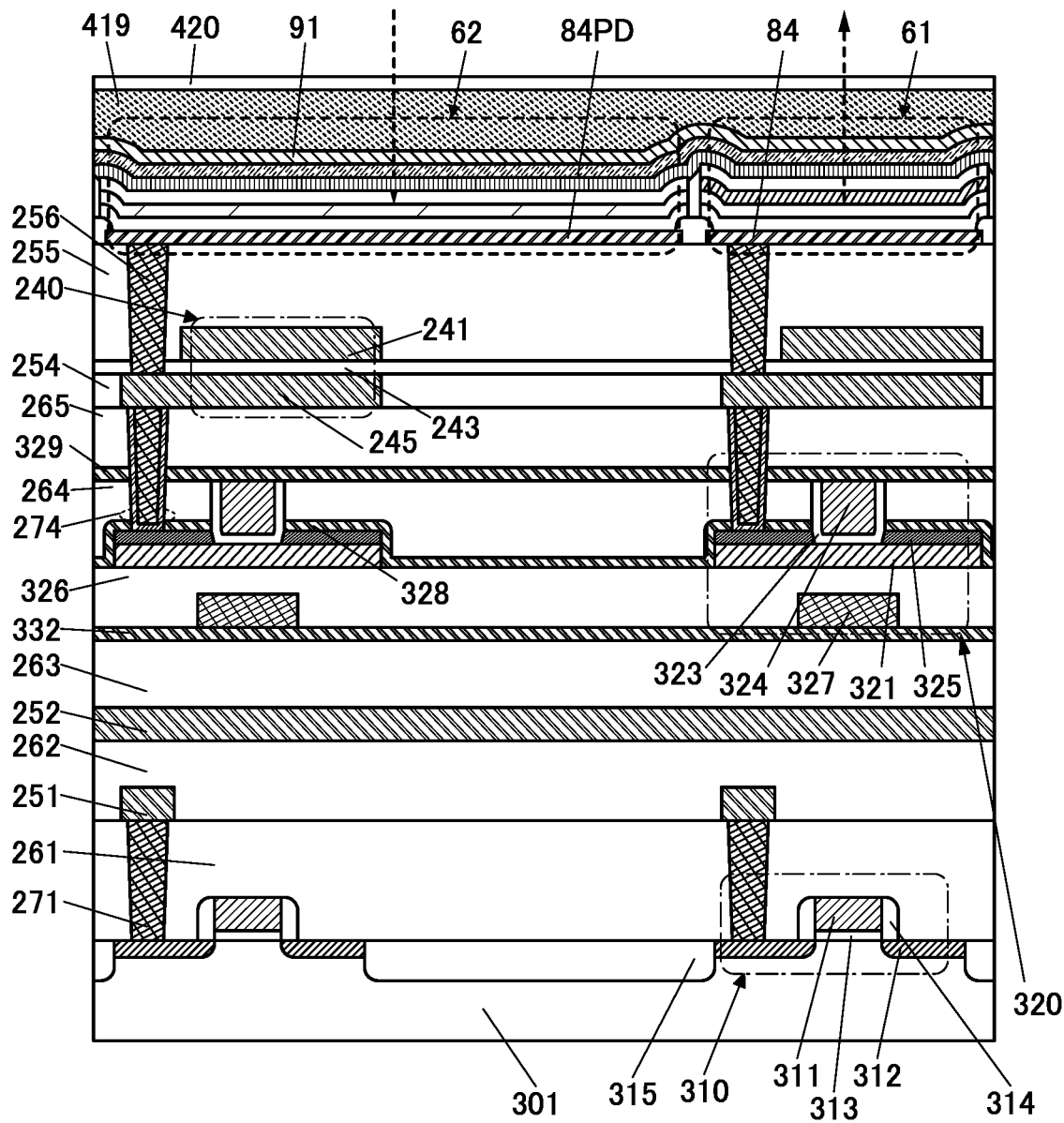
FIG. 21 illustrates a structure example of a display device.

FIG. 21 is a cross-sectional view illustrating a structure example of the display device 10. The display device 10 has a structure in which the transistor 310 whose channel is formed in the substrate 301 and a transistor 320 including a metal oxide in a semiconductor layer where a channel is formed are stacked.

An insulating layer 261 is provided so as to cover the transistor 310, and a conductive layer 251 is provided over the insulating layer 261. The insulating layer 262 is provided so as to cover the conductive layer 251, and the conductive layer 252 is provided over the insulating layer 262. The conductive layer 251 and the conductive layer 252 each function as a wiring. An insulating layer 263 and the insulating layer 332 are provided so as to cover the conductive layer 252, and the transistor 320 is provided over the insulating layer 332. An insulating layer 265 is provided so as to cover the transistor 320, and the capacitor 240 is provided over the insulating layer 265. The capacitor 240 and the transistor 320 are electrically connected to each other through a plug 274.

The transistor 320 can be used as a transistor included in a pixel circuit or a transistor included in a memory cell. The transistor 310 can be used as a transistor included in a memory cell, a transistor included in a driver circuit for driving the pixel circuit, or a transistor included in an arithmetic circuit. The transistor 310 and the transistor 320 can also be used as transistors included in a variety of circuits such as an arithmetic circuit and a memory circuit.

The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided so as to cover a side surface of the conductive layer 311 and functions as an insulating layer.

An element isolation layer 315 is provided between two adjacent transistors 310 so as to be embedded in the substrate 301.

The transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film can be used. Examples of such a film include an aluminum oxide film, a hafnium oxide film, and a silicon nitride film.

The conductive layer 327 is provided over the insulating layer 332, and the insulating layer 326 is provided so as to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. For the semiconductor layer 321, a metal oxide containing at least one of indium, zinc, and the element M (the element M is aluminum, gallium, yttrium, or tin) is preferably used. An OS transistor including such a metal oxide in a channel formation region has a characteristic of an extremely low off-state current. Thus, it is preferable that such an OS transistor be used as a transistor provided in a pixel circuit, in which case analog data written to the pixel circuit can be retained for a long time. Similarly, it is preferable that such an OS transistor be used as a transistor provided in a memory cell, in which case analog data written to the memory cell can be retained for a long time.

The pair of conductive layers 325 is provided on and in contact with the semiconductor layer 321, and functions as a source electrode and a drain electrode.

An insulating layer 328 is provided so as to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with side surfaces of the insulating layers 264 and 328, a side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and the insulating layer 265 are provided so as to cover these layers.

The insulating layers 264 and 265 each function as an interlayer insulating layer. The insulating layer 329 functions as a barrier layer that prevents diffusion of impurities such as water and hydrogen from the insulating layer 265 and the like to the transistor 320. For the insulating layer 329, an insulating film similar to those used for the insulating layers 328 and 332 can be used.

The plug 274 electrically connected to one of the pair of conductive layers 325 is provided so as to be embedded in the insulating layers 265, 329, and 264.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 245 is provided over the insulating layer 265 and is embedded in the insulating layer 254. The conductive layer 245 is electrically connected to one of a source and a drain of the transistor 320 through the plug 274 embedded in the insulating layers 328, 264, 329, and 265. The insulating layer 243 is provided so as to cover the conductive layer 245. The conductive layer 241 is provided in a region overlapping with the conductive layer 245 with the insulating layer 243 therebetween.

An insulating layer 255 is provided so as to cover the capacitor 240, and the light-emitting device 61, the light-receiving device 62, and the like are provided over the insulating layer 255. The protective layer 91 is provided over the light-emitting device 61 and the light-receiving device 62, and a substrate 420 is bonded to the top surface of the protective layer 91 with a resin layer 419. A light-transmitting substrate can be used as the substrate 420.

The pixel electrode 84 of the light-emitting device 61 and the pixel electrode 84PD of the light-receiving device 62 are electrically connected to one of the source and the drain of the transistor 320 through the plug 256 embedded in the insulating layer 255, the conductive layer 245 embedded in the insulating layer 254, and the plug 274 embedded in the insulating layers 328, 264, 329, and 265.

With such a structure, OS transistors included in a pixel circuit and a memory cell as well as the driver circuit, an arithmetic circuit, and the like can be provided directly under the light-receiving device and the light-emitting device; thus, the size of a display device with higher performance can be reduced.

At least part of this embodiment can be implemented in combination with any of the other embodiments described in this specification, as appropriate.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions or a case where a plurality of circuits are associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, variations in signal, voltage, or current due to noise or difference in timing can be included.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" and "wiring" do not limit the functions of the components. For example, an "electrode" is used as part of a wiring in some cases, and vice versa. Furthermore, the terms "electrode" or "wiring" can also mean a combination of a plurality of electrodes or wirings provided in an integrated manner, for example.

In this specification and the like, "voltage" and "potential" can be replaced with each other as appropriate. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed to the term "conductive film" in some cases. Also, for example, the term "insulating film" can be changed to the term "insulating layer" in some cases.

In this specification and the like, a switch is in a conductive state (on state) or in a non-conductive state (off state) to determine whether current flows therethrough or not. Alternatively, a switch has a function of selecting and changing a current path.

In this specification and the like, the channel length refers to, for example, the distance between a source and a drain in a region where a semiconductor (or a portion where a current flows in a semiconductor when a transistor is in an on state) and a gate overlap with each other or a region where a channel is formed in the top view of the transistor.

In this specification and the like, the channel width refers to, for example, the length of a portion where a source and a drain face each other in a region where a semiconductor (or a portion of the semiconductor in which a current flows when a transistor is in an on state) and a gate electrode overlap with each other or in a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers are separately formed or patterned to make light-emitting devices for emission colors (e.g., blue (B), green (G), and red (R)) is called a side by side (SBS) structure in some cases. In this specification and the like, a light-emitting device capable of emitting white light is called a white light-emitting device in some cases. Note that a white light-emitting device can be a full-color-display light-emitting device by being combined with a coloring layer (e.g., a color filter).

The light-emitting devices can be roughly classified into a single structure and a tandem structure. It is preferable that a device having a single structure include one light-emitting unit between a pair of electrodes and the light-emitting unit include one or more light-emitting layers. To obtain white light emission, two or more light-emitting layers may be selected such that emission colors of the light-emitting layers are complementary colors. Thus, the emission colors of the first light-emitting layer and the second light-emitting layer are made complementary, so that the whole light-emitting device can emit white light, for example. This can be applied to a light-emitting device including three or more light-emitting layers.

It is preferable that a device having a tandem structure include two or more light-emitting units between a pair of electrodes and each light-emitting unit include one or more light-emitting layers. To obtain white light emission, white light may be obtained by combining light emitted from light-emitting layers of a plurality of light-emitting units. Note that the structure that can provide white light emission is similar to that of the single structure. In the device having a tandem structure, an intermediate layer such as a charge-generation layer is preferably provided between the plurality of light-emitting units.

When the above-described white light-emitting device (including a single structure or a tandem structure) and a light-emitting device having an SBS structure are compared, the light-emitting device having an SBS structure can have lower power consumption than the white light-emitting device. In the case where power consumption is required to be low, the light-emitting device having an SBS structure is preferably used. In contrast, the white light-emitting device is preferable in that the manufacturing cost is low and the manufacturing yield is high because a process for manufacturing the white light-emitting device is easier than that for the light-emitting device having an SBS structure.

This application is based on Japanese Patent Application Serial No. 2021-024762 filed with Japan Patent Office on Feb. 19, 2021, the entire contents of which are hereby incorporated by reference.

What is claimed is:

1. A wearable device comprising:
a display portion comprising:
a plurality of pixels each comprising:
a first light-emitting device configured to emit light having a first wavelength;
a first light-receiving device configured to convert visible light into an electric signal;
a second light-receiving device configured to convert infrared light into an electric signal; and
a pixel circuit configured to control light emission of the first light-emitting device;
a driver circuit configured to control the pixel circuit; and
an arithmetic circuit configured to perform arithmetic processing in an artificial neural network,
wherein the plurality of pixels is configured:
to capture an image of an user's eye and the surrounding of the eye;
to produce a plurality of currents by the first light-receiving device and the second light-receiving device of each of the plurality of pixels when the image is captured; and
to output the plurality of currents to the arithmetic circuit, and
wherein the arithmetic circuit is configured to infer a body temperature of the user on the basis of a first data corresponding to the plurality of currents.

2. The wearable device according to claim 1,
wherein the arithmetic circuit comprises a first transistor and a second transistor,
wherein the first transistor includes a semiconductor layer comprising silicon in a channel formation region, and
wherein the second transistor includes a semiconductor layer comprising a metal oxide in a channel formation region.

3. The wearable device according to claim 2, wherein the metal oxide comprises In, Zn, and an element M where M is Al, Ga, Y or Sn.

4. The wearable device according to claim 1,
wherein each of the first light-receiving device and the second light-receiving device comprises an organic light-emitting diode, and
wherein the first light-emitting device is an organic EL device.

5. The wearable device according to claim 1, wherein a block including the first light-emitting device and a block including the first light-receiving device and the second light-receiving device are separated from each other.

6. The wearable device according to claim 1, further comprising a mounting portion and a pair of lenses.

7. The wearable device according to claim 1,
wherein the plurality of pixels further comprises a second light-emitting device configured to emit light having a second wavelength,
wherein the first wavelength is in a visible light region, and
wherein the second wavelength is in a infrared light region.

* * * * *